(12) United States Patent
Kawano

(10) Patent No.: US 8,310,039 B2
(45) Date of Patent: Nov. 13, 2012

(54) SEMICONDUCTOR DEVICE

(75) Inventor: Masaya Kawano, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/227,065

(22) Filed: Sep. 7, 2011

(65) Prior Publication Data

US 2011/0316124 A1 Dec. 29, 2011

Related U.S. Application Data

(62) Division of application No. 12/128,331, filed on May 28, 2008, now Pat. No. 8,022,529, which is a division of application No. 11/094,152, filed on Mar. 31, 2005, now Pat. No. 7,541,677.

(30) Foreign Application Priority Data

Mar. 31, 2004 (JP) ................................. 2004-108304

(51) Int. Cl.
*H01L 23/48* (2006.01)

(52) U.S. Cl. . 257/688; 257/621; 257/758; 257/E29.113; 257/E23.01

(58) Field of Classification Search .................. 257/688, 257/621, 758, E29.113, E23.01
See application file for complete search history.

(56) References Cited

U.S. PATENT DOCUMENTS

| | | | |
|---|---|---|---|
| 5,824,599 A | 10/1998 | Schacham-Diamond et al. | |
| 6,054,857 A | 4/2000 | Doty | |
| 6,197,685 B1 | 3/2001 | Domae et al. | |
| 6,278,352 B1 | 8/2001 | Huang et al. | |
| 6,323,546 B2 | 11/2001 | Hsuan et al. | |
| 6,407,420 B1 | 6/2002 | Yamanaka et al. | |
| 6,461,956 B1 | 10/2002 | Hsuan et al. | |
| 6,509,209 B1 | 1/2003 | Shroff et al. | |
| 6,617,681 B1 | 9/2003 | Bohr | |
| 6,649,955 B2 | 11/2003 | Lee | |
| 6,871,396 B2 | 3/2005 | Sugaya et al. | |
| 7,354,798 B2 | 4/2008 | Pogge et al. | |

(Continued)

FOREIGN PATENT DOCUMENTS

JP 05-102200 4/1993

(Continued)

OTHER PUBLICATIONS

Masataka Hoshino et al., "Wafer Process and issue of Through Electrode in Si wafer Using Cu Damascene for Three Dimensional Chip Stacking," Electronic System Integration Technology Research Department, Association of Super-Advanced Electronic Technologies, 3 pages.

(Continued)

*Primary Examiner* — Kimberly Rizkallah
*Assistant Examiner* — Timor Karimy
(74) *Attorney, Agent, or Firm* — Young & Thompson

(57) ABSTRACT

A semiconductor device having a through electrode excellent in performance as for an electrode and manufacturing stability is provided. There is provided a through electrode composed of a conductive small diameter plug and a conductive large diameter plug on a semiconductor device. A cross sectional area of the small diameter plug is made larger than a cross sectional area and a diameter of a connection plug, and is made smaller than a cross sectional area and a diameter of the large diameter plug. In addition, a protruding portion formed in such a way that the small diameter plug is projected from the silicon substrate is put into an upper face of the large diameter plug. Further, an upper face of the small diameter plug is connected to a first interconnect.

11 Claims, 12 Drawing Sheets

U.S. PATENT DOCUMENTS

2002/0001936 A1  1/2002  Terauchi et al.

FOREIGN PATENT DOCUMENTS

| JP | 2000-311982 | 11/2000 |
| JP | 2002-289623 | 4/2002 |
| JP | 2003-017558 | 1/2003 |
| JP | 2003-151978 | 5/2003 |
| JP | 2004-014657 | 1/2004 |

OTHER PUBLICATIONS

Japanese Patent Office issued a Japanese Office Action dated May 12, 2009, Application No. 2004-108304.

SEMICONDUCTOR DEVICE

CROSS REFERENCE TO RELATED APPLICATIONS

This application is a division of copending application Ser. No. 12/128,331 filed on May 28, 2008, which is related to application Ser. No. 12/427,366 filed on Apr. 21, 2009, both of which are divisions of application Ser. No. 11/094,152 filed on Mar. 31, 2005, now U.S. Pat. No. 7,541,677, which claims priority to Japanese patent application No. 2004-108304. The entire content of each of these applications is hereby incorporated by reference.

BACKGROUND OF THE INVENTION

1. Field of the Invention

The present invention related to a semiconductor device and a method for manufacturing the same.

2. Related Art

In recent years a semiconductor device necessitates to be lightweight, thin, and short sized, and a high performance. In the semiconductor device such as multi-chip package or the like, realizing high density interconnect, miniaturization of a logic chip and capacity increase of a memory is aggressively promoted.

As for one corresponding medium coping with such proposals, it is tried that realizing high density interconnect or the like is achieved upon providing a through electrode on the semiconductor substrate. A through electrode as for the conventional one is described in the Japanese Laid-Open Patent Publication No. 2000-311982.

The Japanese Laid-Open Patent Publication No. 2000-311982 discloses the semiconductor device having the through electrode. Configuration of the through electrode is that an intermediate insulating layer is provided on an inner circumferential surface of the through hole penetrating the semiconductor chip substrate, and a conductive layer is filled in the through hole inside the intermediate insulating layer. According to the Japanese Laid-Open Patent Publication No. 2000-311982, if the configuration is used, this makes it possible to form plural semiconductor chip substrates three-dimensionally with high density.

In addition, although a technical field is different, there is a technique described in "Wafer Process and Issue of Through Electrode in Si wafer Using Cu Damascene for Three Dimensional Chip Stacking" By Masataka Hoshino and other five members, 2002, Proceedings of the International Interconnect Technology Conference p. 75 to 77 (Masataka Hoshino et. al,), as for a technique to remove the semiconductor substrate and a metal film simultaneously. The Masataka Hoshino et. al, describes the semiconductor substrate including the process in which grinding a rear surface is performed, after forming an electrode, that is described later.

SUMMARY OF THE INVENTION

On the other hand, the through electrode described in the Japanese Laid-Open Patent Publication No. 2000-311982 has structure in which thick through electrode is penetrated through the semiconductor chip substrate, so that it is not possible to provide interconnect or the like on a region at which the through electrode is formed. For this reason, it has now been discovered that integration density of the interconnect or the like decreases, therefore, there is still room for further improvement on realizing high density interconnect. Further, there is a fear that reliability of the element deteriorates at the time the through electrode is formed because the through electrode is formed after forming elements.

According to the present invention, there is provided a semiconductor device comprising: a semiconductor substrate; an insulating layer provided on a main surface of the semiconductor substrate and having a conductive component therein; and a through electrode penetrating the semiconductor substrate and connected to the conductive component; wherein the through electrode including: a first conductive plug connected to the conductive component; and a second conductive plug provided in the semiconductor substrate and connected to the first conductive plug, the second conductive plug has a cross sectional area larger than a cross sectional area of the first conductive plug.

In the semiconductor device of the present invention, the first conductive plug with smaller cross sectional area than the second conductive plug is disposed at the side of the main face, therefore, it is possible to enhance integration density of the interconnect in the vicinity of the through electrode. For this reason, the configuration is suitable for miniaturization.

According to the present invention, there is provided a semiconductor device comprising a semiconductor substrate, an insulating layer provided on a main face of the semiconductor substrate, and a through electrode, which penetrates the semiconductor substrate, connecting a conductive component provided on an inside of the insulating layer, wherein the through electrode comprises a first conductive plug connecting the conductive component, and a second conductive plug, which is provided in the semiconductor substrate and which has a cross sectional area larger than a cross sectional area of the first conductive plug, involving a part of the first conductive plug.

In the present specification, a main face is of a face of a semiconductor substrate on which semiconductor elements are formed. In addition, although the second conductive plug is provided on the semiconductor substrate, a part of the second conductive plug may reside within the insulating film provided on the main face.

In the semiconductor device of the present invention, a part of the first conductive plug is involved in the second conductive plug. For this reason, anchor effect is suitably obtained, so that configuration of these plugs is excellent in adhesion. Further, the configuration reduces contact resistance between these plugs. Further, the first conductive plug with small cross sectional area is disposed at the side of the main face, therefore, it is possible to enhance integration density of the interconnect in the vicinity of the through electrode. For this reason, the configuration is suitable for miniaturization.

According to the present invention, there is provided a semiconductor device comprising a semiconductor substrate, a transistor formed layer provided on a main face of the semiconductor substrate, an interconnect layer provided on an upper portion of the transistor formed layer, an upper interconnect layer provided on an upper portion of the interconnect layer, and a through electrode penetrating the transistor formed layer and the semiconductor substrate, wherein the through electrode comprises a first conductive plug connecting an interconnect formed in the interconnect layer and provided in the transistor formed layer, and a second conductive plug, which is provided in the semiconductor substrate and which has a cross sectional area larger than a cross sectional area of the first conductive plug, connecting the first conductive plug.

In the semiconductor device of the present invention, the first conductive plug is connected to the interconnect layer coated to the upper interconnect layer. Further, configuration is that the cross sectional area of the first conductive plug is smaller than the cross sectional area of the second conductive plug. For this reason, the configuration makes it possible to enhance integration of an upper layer of the interconnect layer and the elements. Accordingly, the semiconductor device of the present invention realizes configuration suitable for miniaturization. It should be noted that, in the above semiconductor device, the first conductive plug is provided in the transistor formed layer, however, also it may be suitable that a part of the first conductive plug reside in the substrate. In addition, the second conductive plug is provided on the semiconductor substrate, however, also it may be suitable that a part of the second conductive plug reside in the insulating film.

In the semiconductor device of the present invention, it may be suitable to adopt configuration in which the upper interconnect layer connects to the interconnect layer. The semiconductor device of the present invention can improve integration density of the interconnect provided on the interconnect layer and the upper interconnect provided on the upper interconnect layer even the case of configuration where the upper interconnect layer is connected to the through electrode via the interconnect layer.

In the semiconductor device of the present invention, it may be adopted configuration where the first conductive plug is involved in the second conductive plug. Owing to this, the anchor effect can be surely obtained. For this reason, adhesion of these plugs can be improved. Further, it is possible to realize configuration where contact resistance between these plugs is reduced.

In the semiconductor device of the present invention, it may suitably be adopted configuration where a part of the plurality of the first conductive plugs is involved in the second conductive plug. Owing to this, it is possible to further surely obtain the anchor effect. For this reason, adhesion of these plugs can be further improved. Further, it is possible to realize configuration where contact resistance between these plugs is further reduced.

In the semiconductor device of the present invention, the second conductive plug may be formed across vicinity of the main face of the semiconductor substrate from a rear surface of the semiconductor substrate. In addition, in the semiconductor device of the present invention, the second conductive plug may be positioned at a potion lower than the main face of the semiconductor substrate. In such a way as above, the integration density of the element or the interconnect on the semiconductor substrate can be further improved.

In the semiconductor device of the present invention, it may be suitable to adopt configuration where a part of the first conductive plug is put into the second conductive plug. For this reason, it is possible to further surely improve adhesive of both plugs.

In the semiconductor device of the present invention, it may be suitable to adopt configuration where the second conductive plug comes into contact with the semiconductor substrate via an insulating film. For this reason, it is possible to realize configuration with manufacturing easiness. Further, it is possible to decrease parasitic capacitance. For instance, in the present invention, the insulating film can be made with an electrodeposited insulating film.

In the semiconductor device of the present invention, it may be suitable to adopt configuration where the second conductive plug is projected from a rear surface of said semiconductor substrate. Therefore, it is possible to realize configuration being further excellent in manufacturing stability.

In the semiconductor device of the present invention, it may be suitable to adopt configuration where a cylindrical ring shaped insulating body is disposed on an outer periphery of a side face of the second conductive plug. For this reason, it is possible to reduce surely parasitic capacitance.

In the semiconductor device of the present invention, it may be suitable to adopt configuration where a cross sectional area of the through electrode in the main face of the semiconductor substrate is smaller than a cross sectional area of the through electrode in a rear surface of the semiconductor substrate. Owing to this, it is possible to enhance integration density of the interconnect formed on an upper portion of the main face.

According to the present invention, there is provided a method for manufacturing a semiconductor device comprising: forming a first hole at a main surface of a semiconductor substrate; forming a first conductive plug in the first hole; forming a second hole at a rear surface of the semiconductor substrate to expose the first conductive plug therein; and forming a second conductive plug in the second hole to be connected to the first conductive plug.

According to the method, it is possible to stably manufacture the semiconductor device with simple process that has a through electrode that is excellent in adhesion between the first conductive plug and the second conductive plug.

According to the present invention, there is provided a method for manufacturing a semiconductor device comprising: forming an opening at a main surface of a semiconductor substrate; filling the opening with an insulating material; forming an insulating layer on the semiconductor substrate; forming a first hole penetrating the insulating layer to expose a part of the insulating material in a bottom of the first hole; forming a first conductive plug in the first hole; removing a part of the semiconductor substrate at a rear surface of the semiconductor substrate to expose the insulating material; removing the insulating material to form a second hole, a part of the first conductive plug is exposed in the second hole; and forming a second conductive plug in the second hole to be connected to the part of first conductive plug exposed in the second hole.

According to the method, it is possible to further stably manufacture the semiconductor device having the through electrode that is excellent in adhesion between the first conductive plug and the second conductive plug.

According to the present invention, there is provided a method for manufacturing a semiconductor device comprising: forming a first hole at a side of a main face of a semiconductor substrate, forming a barrier film made of insulating materials on an inner wall of the first hole, embedding a first metal film so as to embed an inside of the first hole, forming a first conductive plug on an inside of the first hole while removing the first metal film formed on an outside of the first hole, exposing a part of the first conductive plug on the inside of a second hole while forming the second hole upon removing the semiconductor substrate selectively from a rear surface side, exposing the first metal film while removing at least a part of the barrier film exposed, and forming a second conductive plug involving a part of the first conductive plug while causing a second metal film to grow so as to embed the second hole after exposing the first metal film.

According to this method, it is possible to stably manufacture the semiconductor device with simple process that has a through electrode that is excellent in adhesion between the first conductive plug and the second conductive plug.

In the present invention, the first conductive plug includes the first metal film and the barrier film. In addition, in the present invention, the first metal film may include the barrier metal film.

In a method for manufacturing the semiconductor device of the present invention, the method comprises forming a cylindrical ring shaped insulating body by embedding an insulating body on an inside of a hole, while forming a cylindrical ring shaped hole by selectively removing the semiconductor substrate from a side of the main face before forming the first hole; forming the first hole comprises forming the first hole while removing a part of an inside region of the cylindrical ring shaped insulating body of the semiconductor substrate; and forming the second hole comprises forming the second hole while removing at least a part of an inside region of the cylindrical ring shaped insulating body of the semiconductor substrate. In such a way as above, it is possible to surely obtain the semiconductor device in which generation of the parasitic capacitance is suppressed.

In the method for manufacturing the semiconductor device of the present invention, forming the first hole may comprise forming the first hole while selectively removing an insulating film and the semiconductor substrate, after forming the insulating film on a side of the main face of the semiconductor substrate. In such a way as above, it is possible to stably obtain the semiconductor device of configuration in which the first conductive plug connects to the interconnect of an upper portion of the insulating film.

According to the present invention, there is provided a method for manufacturing a semiconductor device comprising: forming an insulating plug by embedding an insulating body into an inside of a hole, while forming the hole by removing a semiconductor substrate selectively from a side of a main face of the semiconductor substrate; forming a first hole from which a part of the insulating plug is removed selectively on a side of the main face of the semiconductor substrate; embedding a first metal film so as to embed an inside of the first hole; forming a first conductive plug on the inside of the first hole, while removing the first metal film formed on an outside of the first hole; removing the semiconductor substrate selectively from a side of a rear surface of the semiconductor substrate; exposing a part of the first conductive plug into an inside of a second hole, while forming the second hole by removing the insulating plug selectively after removing the semiconductor substrate; exposing the first metal film, while removing at least a part of the first conductive plug exposed; and forming a second conductive plug involving a part of the first conductive plug, while causing the second metal film to grow so as to embed the second hole after exposing the first metal film.

According to the method, it is possible to further stably manufacture the semiconductor device having the through electrode that is excellent in adhesion between the first conductive plug and the second conductive plug.

In the method for manufacturing the semiconductor device of the present invention, forming the first hole may comprise forming the first hole by removing an insulating film and the insulating plug selectively, after forming the insulating film on a side of the main face of the semiconductor substrate. In such a way as above, it is possible to stably obtain the semiconductor device of configuration in which the first conductive plug connects to the interconnect of an upper portion of the insulating film.

In the method for manufacturing the semiconductor device of the present invention, forming the second hole may comprise forming a hole whose cross sectional area is larger than the first hole. In such a way as above, it is possible to further surely involve a part of the first conductive plug into the second conductive plug.

In the method for manufacturing the semiconductor device, the method for manufacturing the semiconductor device may comprise forming an interconnect layer having an interconnect connecting to the first conductive plug on an upper portion of the main face, after forming the first conductive plug. In such a way as above, it is possible to enhance the integration density of the interconnect connecting to the first conductive plug and the interconnect of the same layer. Owing to this, it is possible to manufacture stably the semiconductor device with high integration density of the interconnect. In addition, in the method for manufacturing the semiconductor device of the present invention, the method for manufacturing the semiconductor device may comprise forming an upper interconnect connecting the interconnect on an upper portion of the interconnect layer. In such a way as above, it is possible to manufacture stably a multilayered semiconductor device in which the integration density of the upper interconnect residing on an upper layer than the interconnect layer is high.

In the method for manufacturing the semiconductor device of the present invention, the method for manufacturing the semiconductor device may comprise providing an insulating layer on an upper portion of the main face of the semiconductor substrate before forming the first hole; and forming the first conductive plug may comprise forming a connection plug connecting to a transistor element at the same time as the first conductive plug on an inside of the insulating layer. Owing to this, it is possible to obtain the semiconductor device with more simple process.

It should be noted that it is effective as the embodiment of the present invention even though these respective constitution are combined arbitrarily, or representation of the present invention is converted in connection with its method, device or the like.

For instance, in the present invention, the method for manufacturing the semiconductor device may comprise making to adhere selectively an insulating material on a region except for the first conductive plug of an inner face of the second hole, before exposing the first metal film, after exposing a part of the first conductive plug. In such a way as above, it is possible to manufacture the semiconductor device that is excellent in insulating characteristics of a surface of the second conductive plug by a simple process.

In the method for manufacturing the semiconductor device of the present invention, the insulating material may be electrodeposited material. In such a way as above, it causes the insulating material to adhere to a region of an inner face of the second hole except for the first conductive plug with further high selectivity.

In the method for manufacturing the semiconductor device of the present invention, the electrodeposited material may be an electrodeposited polyimide. In such a way as above, it is possible to enhance durability of the insulating material to processing in this process and afterward. Consequently, it is possible to stably manufacture the semiconductor device with further high yield.

In addition, in the present invention, embedding the first metal film may comprise forming a barrier metal film on an inner wall of the first hole. In addition, in the present invention, the first metal film can be formed with a multilayered film including the barrier metal film. In such a way as above, it is possible to further surely suppress diffusion of conductive materials composing the first conductive plug toward the semiconductor substrate.

As illustrated above according to the present invention, the through electrode is composed of the first conductive plug provided on the main face side and the second conductive plug whose cross sectional area is larger than that of the first conductive plug of the semiconductor substrate, therefore, there is provided the semiconductor device having the through electrode that is excellent in performance as for the electrode and the manufacturing stability.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

Figure 1:
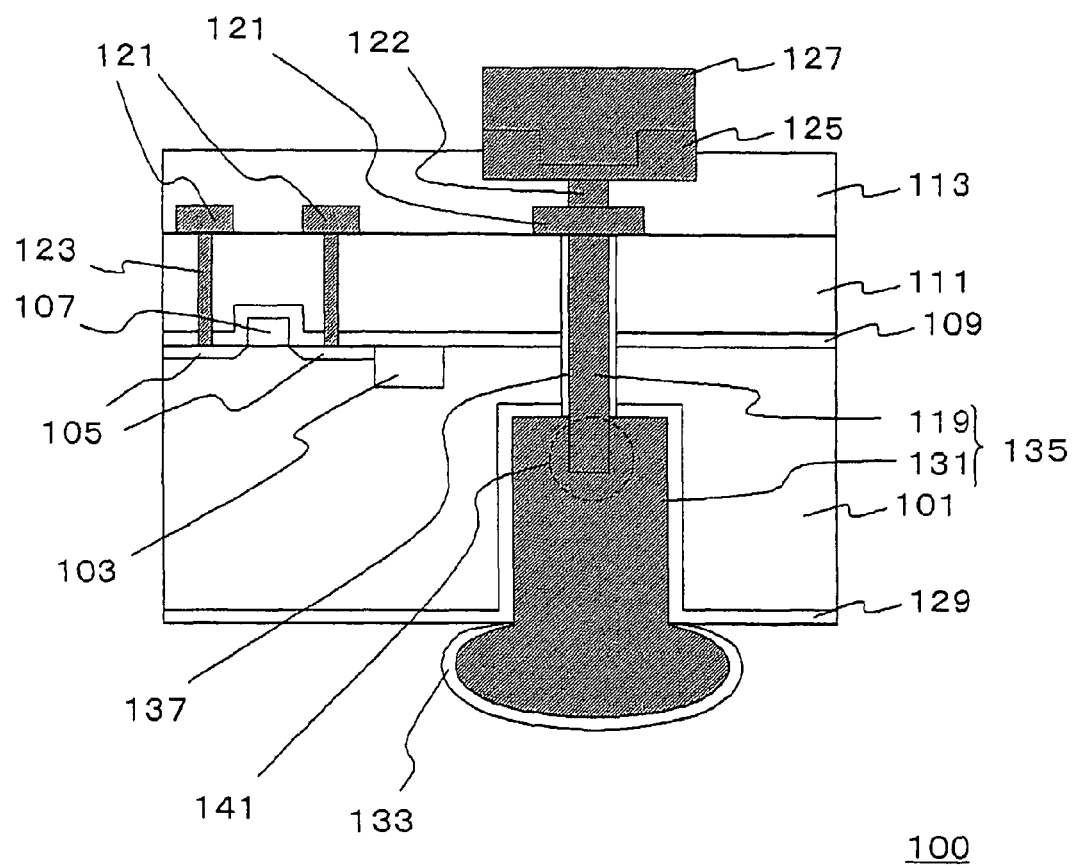
FIG. 1 is a cross-sectional view schematically showing configuration of a semiconductor device according to a present embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposed.

Hereinafter, there will be described an embodiment of the present invention while referring to the drawings. In the whole drawings, the same symbol is attached to the same component, and detailed description will be omitted appropriately in the following explanation. Further, in the following embodiments, a main face side of the semiconductor substrate is set to an upper (front surface) side of the semiconductor device, and a rear surface side of the semiconductor substrate is set to a lower (rear surface) side of the semiconductor device.

First Embodiment

FIG. 1 is a cross-sectional view schematically showing configuration of a semiconductor device according to the present embodiment. The semiconductor device 100 of FIG. 1 has a layered structure formed with a silicon substrate 101, an etching stopper film 109, a lowermost layer insulating film 111, and a first interconnect layer insulating film 113. The semiconductor device 100 is provided with a through electrode 135 penetrating the silicon substrate 101, the etching stopper film 109 and the lowermost layer insulating film 111.

A MOS transistor composed of a diffusion layer 105, a gate electrode 107 and the like, and an isolation film 103 is formed on a main face of the silicon substrate 101. The lowermost layer insulating film 111 is formed so as to embed the MOS transistor and the isolation film 103. The etching stopper film 109 is provided in the lowermost insulating film 111 in such a way as to come into contact with an upper face of the silicon substrate 101 and the gate electrode 107. In addition, there is also provided a connection plug 123 in the lowermost insulating film 111 to connect to the diffusion layer 105.

There is provided a first interconnect 121 and a connection plug 122 to electrically connect to the first interconnect 121 in the first interconnect layer insulating film 113. In addition, on an upper portion of the connection plug 122, a pad 125 to electrically connect to the connection plug 122 and a bump 127 to electrically connect to the pad 125 are formed in this order.

The through electrode 135 has a conductive small diameter plug 119 and a conductive large diameter plug 131. The respective cross sectional area and the diameter of the small diameter plug 119 are larger than the cross sectional area and the diameter of the connection plug 123, and smaller than the cross sectional area and the diameter of the large diameter plug 131. Further, a protruding portion 141, in which the small diameter plug 119 protrudes from the silicon substrate 101, is put into an upper face of the large diameter plug 131.

A diameter of the small diameter plug 119 can be set to, for instance, 1 to 5 μm. Further, the small diameter plug 119 can be set to a configuration where the small diameter plug 119 is put into the silicon substrate 101 to a depth of 20 to 50 μm. Further, length of the protruding portion 141 put into the large diameter plug 131 is set to, for instance, 1 to 50 μm. In addition, the diameter of the large diameter plug 131 is set to, for instance, 10 to 1000 μm.

The small diameter plug 119 penetrates the etching stopper film 109 and the silicon substrate 101 in this order from the upper face of the lowermost-layer insulating film 111, so that a leading end of the small diameter plug 119, which is exposed to the outer portion of the silicon substrate 101, becomes a protruding portion 141. The upper face of the small diameter plug 119 comes into contact with the first interconnect 121, which has a bottom face within the same flat surface as a bottom face of the first interconnect layer insulating film 113, so that electrical connection between the small diameter plug 119 and the first interconnect 121 is secured. A side face of the small diameter plug 119 is coated with SiN film 137 except for the protruding portion 141.

Further, the large diameter plug 131 is formed toward the main face from the rear surface of the silicon substrate 101. The upper face of the large diameter plug 131 is positioned at the lower portion than the upper face of the silicon substrate 101. There is provided an electrodeposited insulating film 129 on the bottom face and side face of the large diameter plug 131, and on the rear surface of the silicon substrate 101. Further, a surface of the large diameter plug 131 is coated with a plating film 133.

Although material of the small diameter plug 119 is not particularly limited, it is possible to use, for instance, W (tungsten). Owing to this, diffusion to the silicon substrate 101 is suitably suppressed. In addition, although material for the large diameter plug 131 and the plating film 133 are not particularly limited, but the materials can be respectively set to, for instance, Ni and Au.

Next, there will be described a method for manufacturing the semiconductor device 100. FIGS. 2A to 2D are sectional views schematically showing the manufacturing process of the semiconductor device 100 shown in FIG. 1.

Firstly, the gate electrode 107, the diffusion layer 105 and the isolation film 103 are formed on the silicon substrate 101. The isolation film 103 is set to, for instance, STI (shallow trench isolation). After that, the etching stopper film 109 and the lowermost-layer insulating film 111 are formed in this order on the entire surface of the upper face of the silicon substrate 101.

At this time, as the etching stopper film 109, for instance, SiN film of 50 nm is formed by plasma CVD technique. Further, as the lowermost-layer insulating film 111, for instance, $SiO_2$ film of 400 nm is formed by plasma CVD technique. Or, as the lowermost-layer insulating film 111, it may suitably be formed the multilayered film in such a way that L-Ox™ film of 300 nm to be a low dielectric constant interlayer insulating film is formed by an application technique, and $SiO_2$ film of 100 nm is formed on an upper face of the L-Ox™ film.

Next, an antireflection film and photoresist are applied in this order on the lowermost-layer insulating film 111, upon using photolithography technique, resulting in forming resist pattern (not shown in the drawings) having an opening corresponding to shape of the small diameter plug 119. A position where the small diameter plug 119 should be provided is opened while making dry etching of the lowermost-layer insulating film 111 with the photoresist film as the mask. And, etching back of the etching stopper film 109 is performed by dry-etching.

After that, etching to the middle of the silicon substrate 101 is further performed while changing etching gas. For instance, etching to the depth of not less than 10 μm to not more than 50 μm from the upper face of the silicon substrate 101 is performed. By making the depth not less than 10 μm, it is possible to connect certainly a periphery of the protruding portion 141 with the large diameter plug 131. Further, by making the depth not more than 50 μm, it is possible to reduce amount of projection of the small diameter plug 119 to an inner portion of the silicon substrate 101 from the main face of the silicon substrate 101. For this reason, it is possible to form an opening stably. The diameter of the opening is selected such that the diameter of the small diameter plug 119 becomes, for instance, degree of 1 to 5 μm. And then, residue of the photoresist film, or the antireflection film or residue caused by etching is removed.

Next, SiN film 137 of 20 nm is formed on the entire surface of the upper face of the silicon substrate 101 on which there is provided the opening corresponding to the shape of the small diameter plug 119. Owing to this, the SiN film 137 is formed on a side face and a bottom face of the opening.

And, a resist pattern (not shown in the drawings) with the opening, which opens corresponding to the shape of the connection plug 123, using the photolithography technique is formed upon applying newly an antireflection film and a photoresist on the lowermost-layer insulating film 111. A position where the connection plug 123 of an upper portion of the diffusion layer 105 is provided is opened while performing dry etching of the lowermost-layer insulating film 111 with the photoresist film as the mask. And, etching back of the etching stopper film 109 is performed by dry-etching to expose the upper face of the diffusion layer 105. Thus the holes to form the small diameter plug 119 and the connection plug 123 are obtained.

Figure 2A:
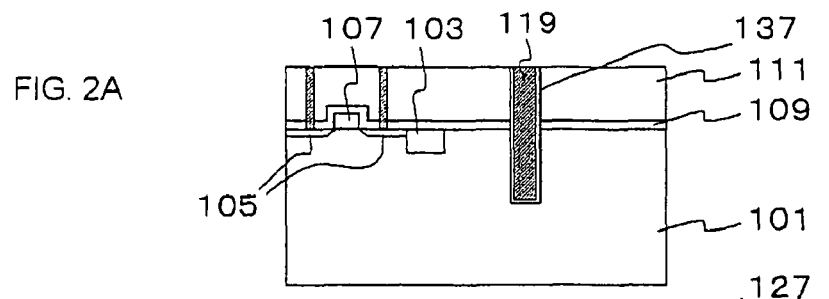
FIGS. 2A to 2D are cross-sectional views illustrating a manufacturing process of the semiconductor device of FIG. 1.

Next, W (tungsten) film as metal film is formed by CVD technique on the entire surface of the upper face of the silicon substrate 101. The film thickness of the W (tungsten) film is set to the film thickness in a state where, by matching to the diameter of both of the connection plug 123 and the small diameter plug 119, the both can be embedded in the connection plug 123 and the small diameter plug 119. For instance, the film thickness of W (tungsten) is set to –degree of 1 μm. Then, W (tungsten) film and the SiN film 137 on the lowermost-layer insulating film 111 are removed by CMP (Chemical Mechanical polishing). Thus, the small diameter plug 119 and the connection plug 123 are formed simultaneously (FIG. 2A).

Figure 2B:
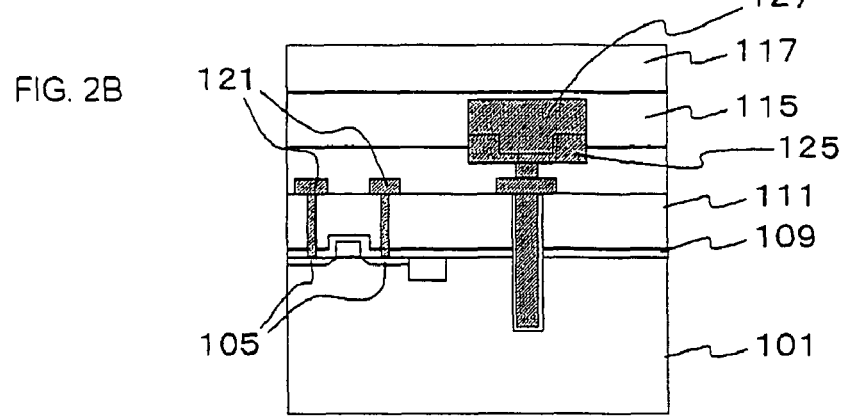

Next, the first interconnect layer insulating film 113 is provided on the entire surface of the upper face of the silicon substrate 101. The first interconnect layer insulating film 113, as shown in FIG. 2B, has a layered structure formed with an insulating film for interconnect 112 and an insulating film for plug 114.

Firstly, the insulating film for interconnect 112 of 300 nm to be an under layer of the first interconnect layer insulating film 113 is formed, while coating the entire surface of the upper face of the silicon substrate 101. The insulating film for interconnect 112 can be set to a low dielectric constant film such as for instance L-Ox™ or the like. At this time, it may be suitable that there is provided SiCN film as Cu diffusion preventing film on the lowermost-layer insulating film 111. Further, it may be suitable that $SiO_2$ film of 100 nm is formed on the low dielectric constant film. Next, an antireflection film and a photoresist are applied on the entire surface of the upper face of the silicon substrate 101 upon using photolithography technique, resulting in forming resist pattern for interconnect trench on the photoresist. Then, an opening for manufacturing the first interconnect 121 is formed while performing etching of the insulating film for interconnect 112 with the photoresist as a mask. Next, the photoresist and the antireflection film are removed by ashing.

After that, by using a sputtering technique, TaN film of 30 nm as for a barrier metal film is formed, and Cu film of 100 nm for a seed is formed on the TaN film. Next, a Cu film of 700 nm is formed by an electrolytic plating technique, subsequently to become the first interconnect 121 is formed by CMP technique. After that, just as the small diameter plug 119 and the connection plug 123 are formed, the first interconnect 121 is formed while removing Cu film and barrier metal film on the insulating film for interconnect 112.

After that, the insulating film for plug 114 constituting an upper layer of the first interconnect layer insulating film 113 is formed on the insulating film for interconnect 112 by usual interconnect manufacturing process. The connection plug 122 to connect to the first interconnect 121 is formed in the insulating film for plug 114. Then, the pad 125 and the bump 127 to connect to the connection plug 122 are formed in this order. Material of the pad 125 may be set to, for instance, Al, Cu, Ni, TiN, or the like. Further, material of the bump 127 may be set to, for instance, Au, solder, or the like.

It should be noted that there may be further formed an upper layer of the predetermined number of interconnect layer or the like on the upper portion of the first interconnect layer insulating film 113.

Next, an adhesive layer 115 is formed on the upper face of the silicon substrate 101 to attach a supporting component 117 (FIG. 2B). For instance, an adhesive tape is used as the adhesive layer 115. The adhesive tape is composed of a base material and the adhesive layer formed on its both sides. As the base material composing the adhesive tape, for instance, polyolefin resin, polyester resin or the like is used. As the adhesive composing the adhesive tape, for instance, an acrylic emulsion adhesive, an acrylic solvent adhesive, a polyurethane adhesive or the like is used.

In addition, materials of the supporting component 117 may be materials provided with durability to heat, agent, external force or the like in the process of thinning processing or the like of the silicon substrate 101 by grinding rear surface described later, thus the materials can be set to, for instance, quarts, Pyrex™ or the like of glasses. Further, it may be set to materials in addition to glass. For instance, materials of plastics or the like such as acrylic resin and so forth may be used.

Next, grinding the rear surface of the silicon substrate 101 is performed. Grinding the rear surface is performed by mechanical polishing. Although thickness of the silicon substrate 101 after grinding can be appropriately selected within the range that a bottom portion of the small diameter plug 119 is not exposed; for instance, the thickness can be set to 50 to 200 µm. Then, the antireflection film and the photoresist are formed in this order on the rear surface of the silicon substrate 101; and the resist pattern (not shown in the drawings) is formed in which an opening to form the large diameter plug 131 is provided, while using the photolithography technique. The silicon substrate 101 is selectively dry-etched with the photoresist film as the mask, after that, the opening 139 is provided at the position where the large diameter plug 131 should be provided.

The opening 139 has a shape, in which, the opening 139 is headed toward the main face from the rear surface of the silicon substrate 101, upper face of the silicon substrate 101 is positioned in a lower portion than vicinity of the main face of the silicon substrate 101. Further, the opening 139 is provided on a bottom portion of the protruding portion 141, and the upper face of the opening 139 is positioned at an upper portion than the bottom face of the small diameter plug 119. The SiN film 137 is provided on the surface of the small diameter plug 119. Etching conditions at the time the above described silicon substrate 101 is performed dry etching are the conditions where selectivity between a silicon film and the SiN film 137 is set to high condition, therefore, when the opening 139 is formed, the small diameter plug 119 is not removed, but the silicon substrate 101 of side face outer periphery of the small diameter plug 119 is selectively removed. Owing to this, the opening 139 is formed with a shape including the bottom face of the small diameter plug 119. Further, a part of the small diameter plug 119 is exposed to outside of the silicon substrate 101, thus the protruding portion 141 is formed.

Figure 2C:
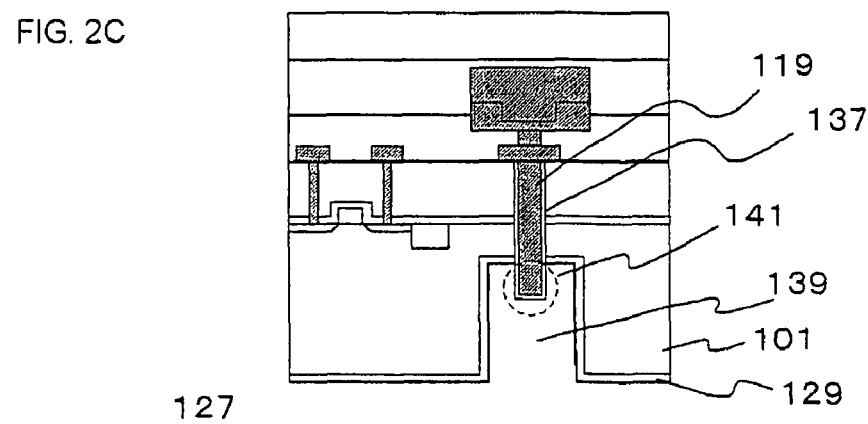

Next, an electrodeposited insulating film 129 is provided on the rear surface of the silicon substrate 101 (FIG. 2C). At this time, the electrodeposited insulating film 129 is selectively formed on the rear surface of the silicon substrate 101, and the bottom face and side face of the opening 139. The surface of the protruding portion 141 is coated with the insulative SiN film 137, so that the electrodeposited insulating film 129 is not formed at outer side of the small diameter plug 119. The film thickness of the electrodeposited insulating film 129 is set to, for instance, degree of 0.5 to 5 µm.

The electrodeposited insulating film 129 is made, for instance, an electrodeposited polyimide film. It is possible to use cationic electrodeposited polyimide coating and anionic electrodeposited polyimide coating as materials of the electrodeposited polyimide film. Specifically, for instance, Elecoat PI manufactured by Shimizu corp. or the like can be used. It should be noted that the material of the electrodeposited insulating film 129 is not limited to polyimide, also it may be used another electrodeposited polymer coatings such as an epoxy containing electrodeposited coating, an acrylic containing electrodeposited coating, fluorine containing electrodeposited coating or the like. Heat-resisting property of the electrodeposited insulating film 129 can be improved upon using the polyimide as the material of the electrodeposited insulating film 129. For this reason, deterioration in manufacturing process afterwards is appropriately suppressed, so that it is possible to realize configuration in which stable manufacturing with a high yield is achieved.

Formation of the electrodeposited insulating film 129 is performed in such a way as, for instance, following process. The silicon substrate is taken as one side of electrode, and one side of electrode and another side of electrode are dipped within the liquid of an electrodeposited coating. Then, predetermined potential is applied to the silicon substrate 101 and another side of electrode depending on electric charge of the polymer within the electrodeposited coating. In such a way as above, the polymer adheres on the surface of the silicon substrate 101. After the predetermined film thickness is obtained, the silicon substrate 101 is taken out from the coating to wash it in water. After that, the electrodeposited insulating film 129 is formed on the rear surface upon baking the silicon substrate 101.

Next, the etching back of the SiN film 137 is performed. Herewith, the SiN film 137 is removed at a leading end of the protruding portion 141 to expose the surface of the small diameter plug 119. At this time, the electrodeposited insulating film 129 is formed on the rear surface of the silicon substrate 101, therefore, the silicon substrate is not removed, but the SiN film 137 is selectively removed. It should be noted that although, in FIG. 1 and FIG. 2D, a configuration in which the whole SiN film 137 in the protruding portion 141 is removed is exemplified, and it may be suitable that at least a portion including a plug bottom portion of the small diameter plug 119 is exposed.

Figure 2D:
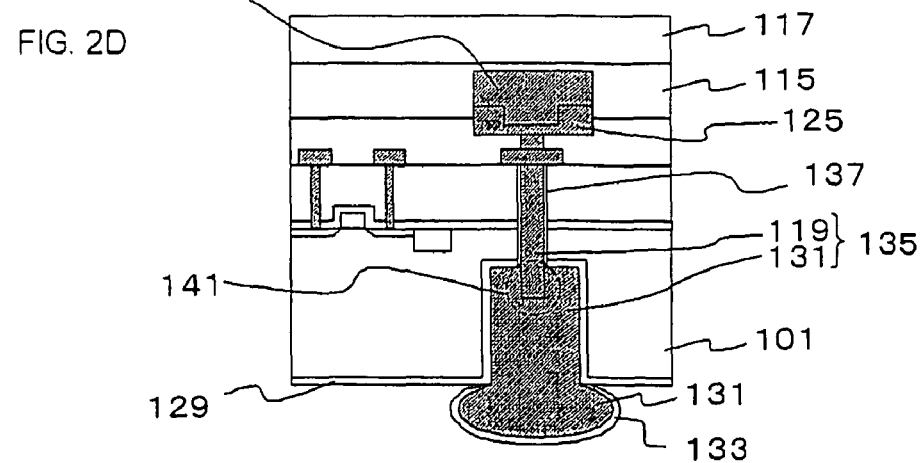

Subsequently, through the electroless plating technique, the Ni film is grown with the exposed portion of the small diameter plug 119 as the starting point, the opening 139 is embedded and the bump is integrally formed at the outside of the opening 139. Then, the large diameter plug 131 is formed upon providing the Au plating film 133 on the surface of the bump (FIG. 2D).

At this time, formation of the large diameter plug 131 may be performed in such a way as to separate into two processes of embedding process of the opening 139 of the rear surface and bump forming process of the rear surface.

After that, upon removing the adhesive layer 115 from the main face of the silicon substrate 101, the supporting component is removed, and the semiconductor device 100 shown in FIG. 1 can be obtained.

Next, there will be described the effect of the semiconductor device 100 shown in FIG. 1.

Firstly, in the semiconductor device 100, the through electrode 135 is composed of two plugs of the small diameter plug 119 and the large diameter plug 131. The protruding portion 141 at the end portion of the small diameter plug 119 is involved in the large diameter plug 131.

Figure 7A:
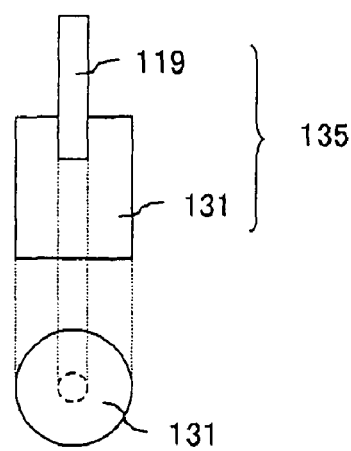
FIGS. 7A to 7C are views schematically showing configuration of a through electrode.
Figure 7B:
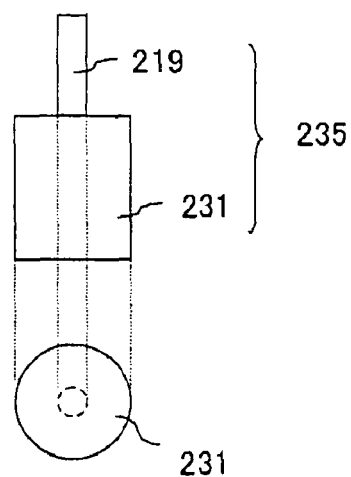

FIG. 7A and FIG. 7B are views schematically showing a configuration of the through electrode composed of two plugs with different thickness. In respective partial drawings, upper view is a sectional view, and the lower view is a plan view. FIG. 7A is a view showing a configuration of the through electrode 135 according to the present embodiment. Further, FIG. 7B is a view showing the through electrode 235 of the shape in which the small diameter plug 219 and the large diameter plug 231 are connected in the plane face.

In the configuration of FIG. 7A, improvement of adhesion of both plugs by an anchor effect is a goal. For this reason, as shown in FIG. 7B, the through electrode can be realized as a bonded configuration as compared to the case where between these end portions are only in contact with each other. Further, selective growing from the rear surface of the silicon substrate 101 makes it possible to form the large diameter plug 131. For this reason, the configuration makes it possible to simplify the manufacturing process. Further, reduction of contact resistance between both plugs is attained based on this configuration. For this reason, it is possible to improve electrical characteristics of the semiconductor device 100.

Figure 7C:
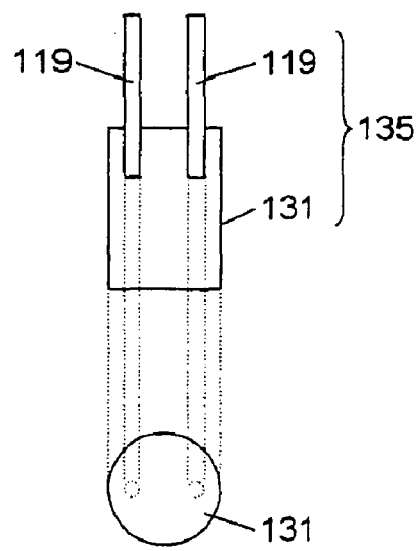

In addition, as shown in FIG. 7C, the through electrode 135 is composed of three plugs of the large diameter plug 131, and two small diameter plugs 119 involved in the large diameter plug 131, adhesion of the plug based on the anchor effect is further improved, and more reduction of the contact resistance is attained.

It should be noted that it is not necessary for the small diameter plug 119 to penetrate until rear surface side of the large diameter plug 131. Since depth of the protruding portion 141 can be made shallow, manufacturing of the small diameter plug 119 by embedding can be performed stably.

Further, in the through electrode 135, the diameter of the small diameter plug 119 is smaller than the diameter of the large diameter plug 131. For this reason, it is possible to minimize the size of the first interconnect 121 electrically connecting to the small diameter plug 119. Further, this configuration can improve integration of elements in the lowermost-layer insulating film 111. Consequently, this configuration is an appropriate configuration for miniaturization of the whole device.

Further, since the small diameter plug 119 can be manufactured at the same time the connection plug 123 is manufactured, the configuration makes it possible to simplify the manufacturing process and to reduce the manufacturing cost accompanied with simple process. Further, the influence of formation of the small diameter plug 119 on formation process of the transistor is small, thus, the configuration is a configuration that formation of the through electrode 135 gives a little damages to the transistor.

Further, in the upper portion of the through electrode 135, the small diameter plug 119 is connected to the first interconnect 121 within the first interconnect layer insulating film 113 to be the lowermost-layer interconnect, so that the configuration causes the through electrode 135 not to protrude into the first interconnect layer insulating film 113. For this reason, this configuration can improve the interconnect density in the first interconnect layer insulating film 113. Consequently, influence of installation of the through electrode 135 on constitution of the circuit is small, so that the semiconductor device 100 has the freedom of selection with respect to elements or interconnect arrangement, and further makes it possible to reduce dead space of the first interconnect layer insulating film 113 and to enhance integration of the first interconnect 121.

Further, in the semiconductor device 100, there is selectively provided the electrodeposited insulating film 129 at the region other than the surface of the protruding portion 141 of the inner surface of the opening 139. For this reason, in the process after forming the large diameter plug 131, since it is possible to use the electrodeposited insulating film 129 as the protective film, it is not necessary to form the resist pattern for formation of the large diameter plug 131 on the rear surface of the silicon substrate 101. For this reason, the configuration makes it possible to manufacture the large diameter plug 131 stably in the simple process.

Figure 8A:
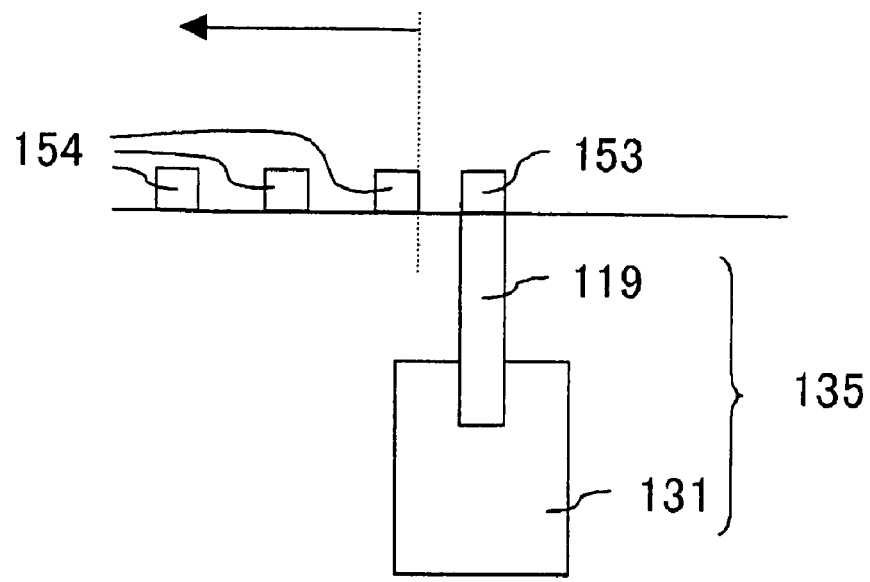
FIGS. 8A and 8B are cross-sectional views schematically showing configuration of the through electrode.
Figure 8B:
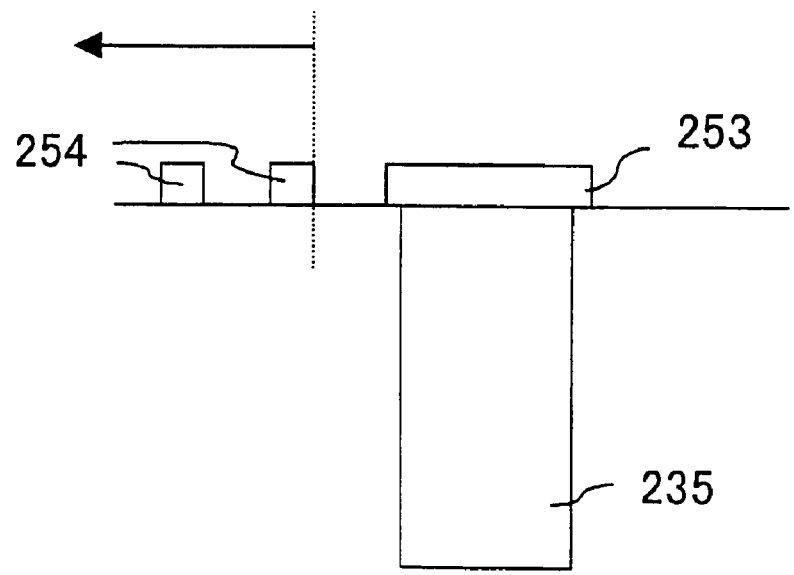

Next, configuration of the through electrode 135 composed of the small diameter plug 119 and the large diameter plug 131 is further described as compared with configuration of the conventional through electrode. FIGS. 8A and 8B are sectional views schematically showing configuration of the through electrode. FIG. 8A is a view schematically showing configuration of the through electrode 135 according to the present embodiment. Further, FIG. 8B is a view schematically showing configuration of the conventional through electrode 235.

As shown in FIG. 8B, the conventional through electrode 235 is composed of one thick plug, and comes into contact with the interconnect 253 on its upper surface. For this reason, the conventional through electrode has tendency that the area of the interconnect 253 on the upper portion of the through electrode 235 becomes relatively large. Further, in the layer of the interconnect 253 coming into contact with the through electrode 235, an interconnect 254 except for the interconnect 253 coming into contact with the through electrode 235 cannot be provided in the vicinity of the through electrode 235. For this reason, as indicated by the arrow in the drawing, it has been possible to form the interconnect 254 other than the interconnect 253 coming into contact with the through electrode 235, only within the region distant from the upper face of the through electrode 235 and its vicinity. Consequently, there is still room for further improvement relative to enhancement of integration of the interconnect 254 other than the interconnect 253 coming into contact with the through electrode 235.

On the contrary, as shown in FIG. 8A, in the through electrode 135 according to the present embodiment, the through electrode comes into contact with the interconnect 153 on the upper face of the small diameter plug 119. For this reason, it is possible to minimize the cross sectional area of the interconnect 153 on the upper portion of the small diameter plug 119. Further, the plug connecting the interconnect 153 is of the small diameter plug 119. For this reason, as indicated by the arrow in the drawing, the region where the interconnect 154 other than the interconnect 153 coming into contact with the small diameter plug 119 can be formed is wide. For this reason, it is possible to enhance integration of the interconnect 154 other than the interconnect 153 coming into contact with the small diameter 119. Further, it is possible to reduce electrical resistance by increasing diameter of the plug other than vicinity of the interconnect layer, while securing sufficiently interconnect density by minimizing diameter of the plug in the vicinity of the interconnect layer.

Further, as described previously while using FIG. 7A and FIG. 7B, in the through electrode 135 in FIG. 8A, the configuration illustrates that a part of the small diameter plug 119 is put into the large diameter plug 131. For this reason, even though two plugs are used, different from configuration of FIG. 8B, contact resistance between these plugs is sufficiently small as compared to configuration of FIG. 7B, thus the configuration has excellent characteristics as the through electrode.

It should be noted that although there is not shown in FIG. 1, in the semiconductor device 100, configuration of the upper layer of the first interconnect layer insulating film 113 can be selected appropriately depending on designing of the device. An interconnect layer or the like may be further formed on the upper portion of the first interconnect layer insulating film 113.

Figure 10:
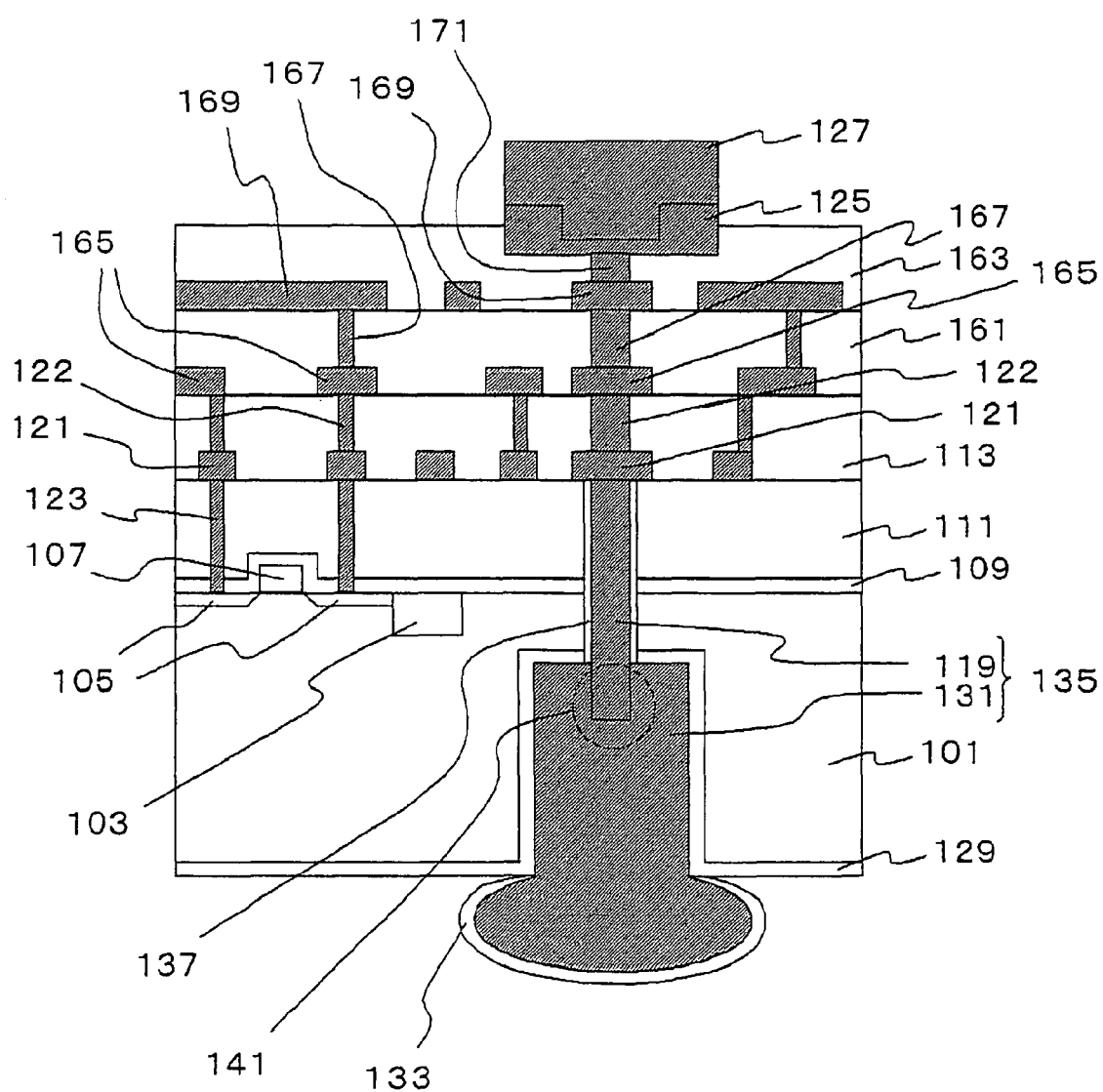
FIG. 10 is a cross-sectional view schematically showing configuration of the semiconductor device according to the present embodiment.

For instance, FIG. 10 is a sectional view schematically showing configuration of the semiconductor device in which the semiconductor device has the layered structure formed with interconnect layers. Although configuration of the semiconductor device in FIG. 10 is the same as the semiconductor device 100 shown in FIG. 1 basically; there are formed a lowermost-layer insulating film 111, the first interconnect layer insulating film 113, and in addition thereto, an insulating layer 161 and an insulating layer 163 are further formed with the layered structure. An interconnect 165 and connection plug 167 are formed in the insulating layer 161. An interconnect 169 and connection plug 171 are formed in the insulating layer 163.

As shown in FIG. 10, the through electrode 135 according to the present embodiment, there is provided the small diameter plug 119 with small cross sectional area at the main face side, and the small diameter plug 119 is connected to the first interconnect 121 provided at lower layer in the formed body. For this reason, it is possible to enhance integration of the interconnect of the upper layer.

Figure 11:
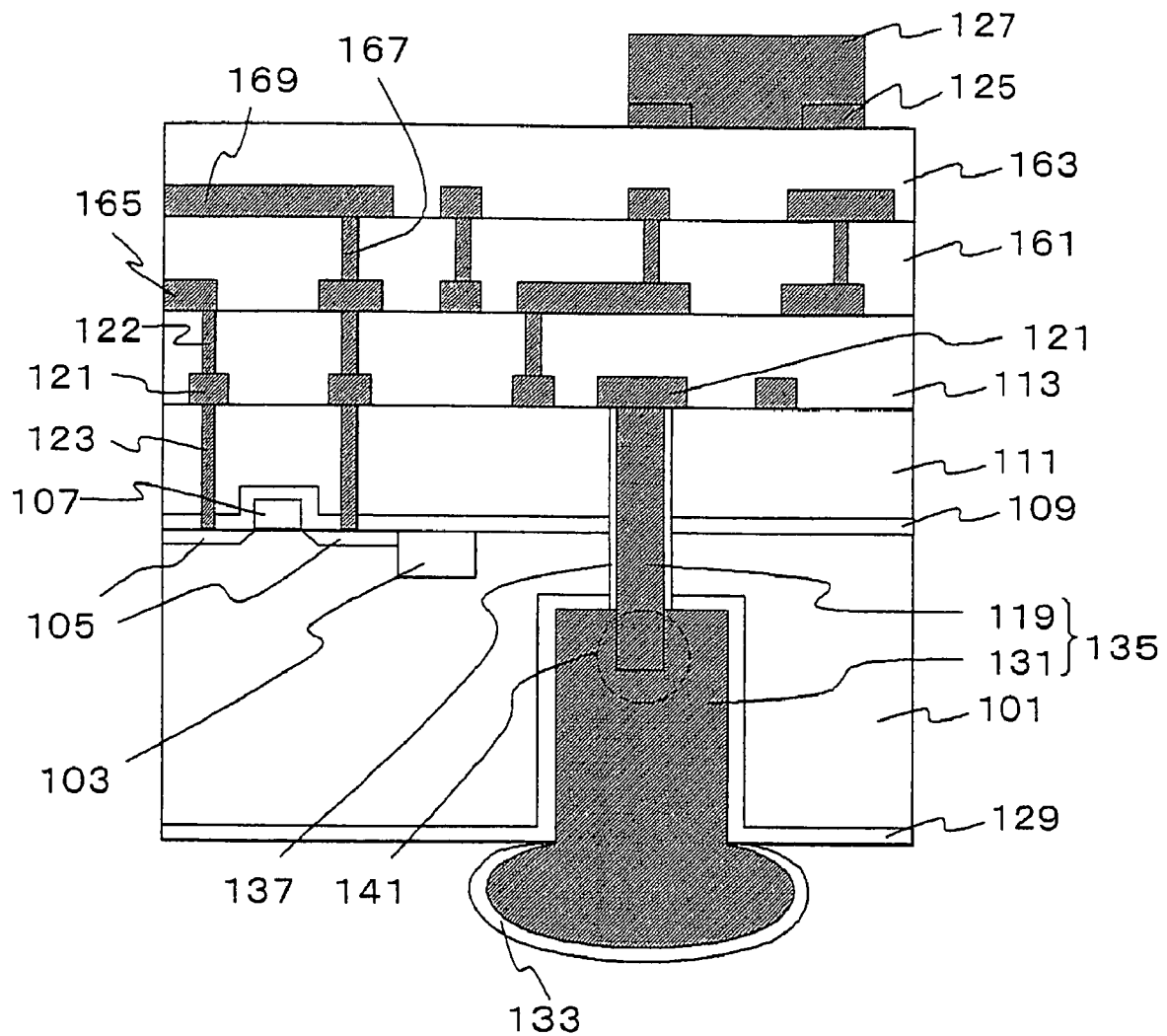
FIG. 11 is a cross-sectional view schematically showing configuration of the semiconductor device according to the present embodiment.

Further, FIG. 11 is a sectional view schematically showing another configuration of the semiconductor device in which the semiconductor device has the layered structure formed with the interconnect layers. As shown in FIG. 11, the small diameter plug 119 is connected to the first interconnect 121, therefore, this configuration is excellent in the freedom of design of the upper layer than the first interconnect 121. For instance, this makes it possible to bring configuration in which the through electrode 135 is not connected to the bump 127, or to bring a configuration in which the through electrode 135 is connected to the bump 127 through an interconnect, which is not shown in the drawing, without forming the bump 127 just above the through electrode 135.

Figure 12A:
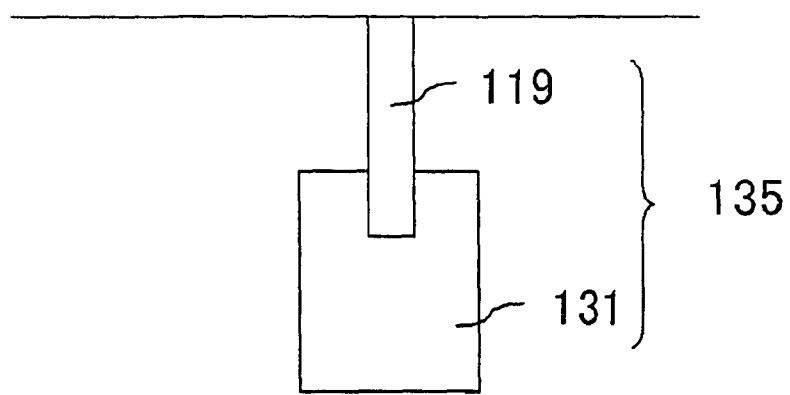
FIGS. 12A and 12B are cross-sectional views schematically showing configuration of the through electrode according to the present embodiment.
Figure 12B:
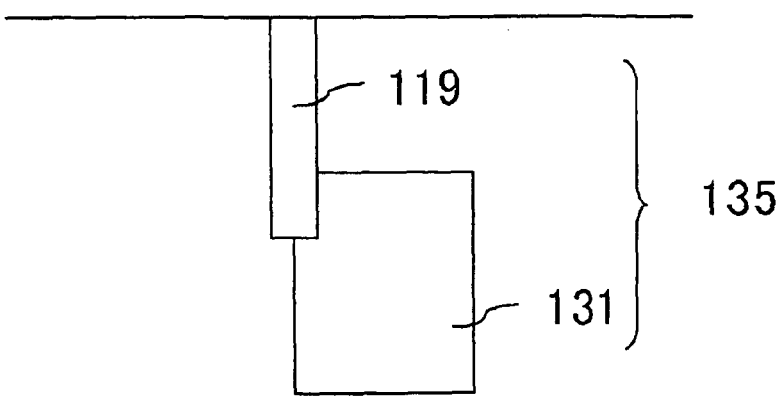

Further, in the semiconductor device according to the present embodiment and the following embodiment, as a mode in which a part of the small diameter plug 119 composing the through electrode 135 is involved in the large diameter plug 131, for instance, a mode in which a part of cross section of the small diameter plug 119 is involved and a mode in which the whole cross section is involved are indicated. FIGS. 12A and 12B are cross sectional views schematically showing such a configuration of the through electrode 135. FIG. 12A is a view showing a configuration in which the whole of cross section of the small diameter plug 119 is involved in the large diameter plug 131. Further, FIG. 12B is a view showing a configuration in which a part of the cross section of the small diameter plug 119 is involved in the large diameter plug 131. The shape of a concave portion formed on the large diameter plug 131 is different depending on a way in a state where the small diameter plug 119 is involved.

As shown in FIGS. 12A and 12B, a configuration in which the small diameter plug 119 comes into contact with the large diameter plug 131 with the plurality of faces thereof can be obtained, upon bringing at least a part of cross section of the small diameter plug 119 to be involved in the large diameter plug 131. For this reason, it is possible to improve adhesion between the small diameter plug 119 and the large diameter plug 131 as compared with configuration described above while using FIG. 7B. Further, as shown in FIG. 12A, it is possible to further improve adhesion between the both components upon adopting a configuration in which the whole cross section of the small diameter plug 119 is put into the large diameter plug 131 to be involved therein.

In the following embodiments, there will be mainly illustrated about the point different from the first embodiment.

Second Embodiment

Figure 3:
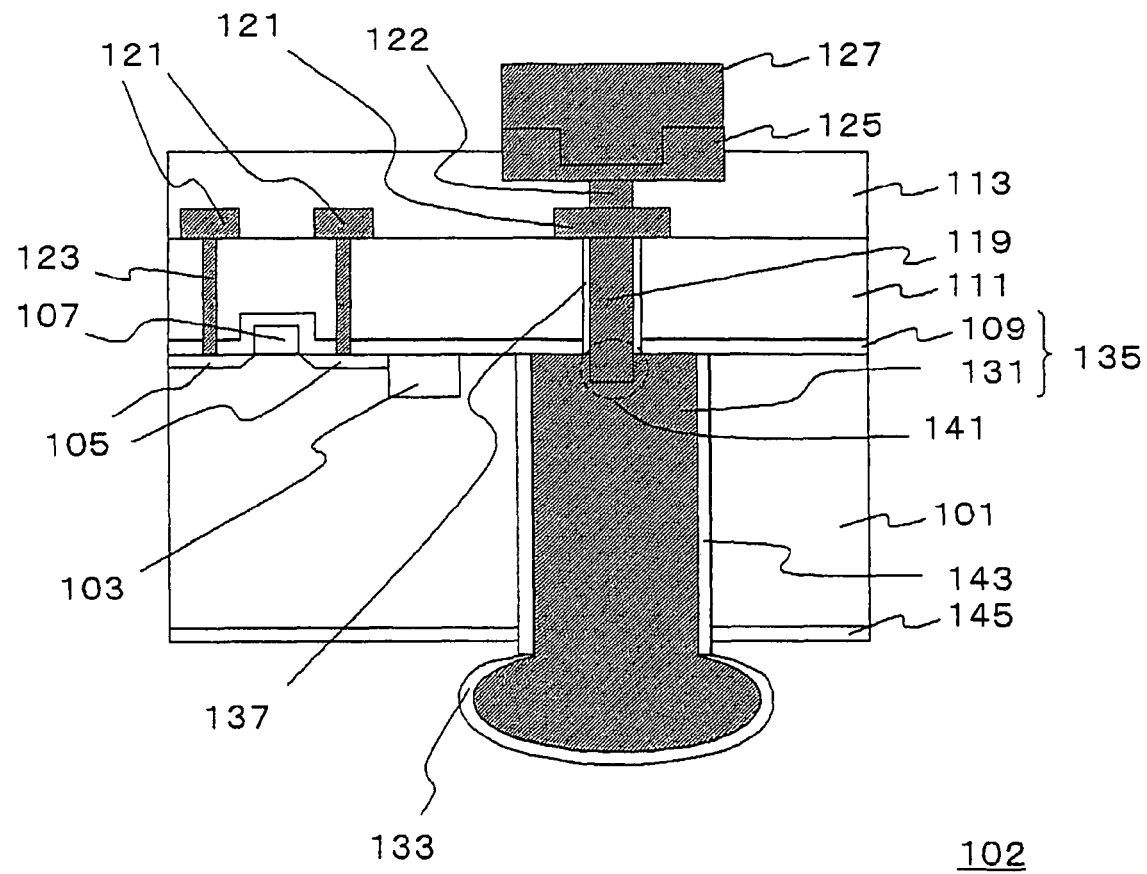
FIG. 3 is a cross-sectional view schematically showing configuration of the semiconductor device according to the present embodiment.

FIG. 3 is a cross-sectional view schematically showing a configuration of the semiconductor device according to the present embodiment. In the semiconductor device 102 shown in FIG. 3, the upper face of the large diameter plug 131 matches the upper face of the silicon substrate 101, that is, the main face of the silicon substrate 101. In addition, in the semiconductor device 102, SiN film 143 is formed on a side face of the large diameter plug 131 and SiN film 145 is formed on a rear surface of the silicon substrate 101 instead of the electrodeposited insulating film 129 in the silicon substrate 101 shown in FIG. 1.

Next, there will be illustrated a method for manufacturing the semiconductor device 102. FIGS. 4A to 4D are cross-sectional views schematically showing the manufacturing process of the semiconductor device 102 shown in FIG. 2.

Firstly, a resist pattern (not shown in the drawings) having an opening corresponding to the shape of the large diameter plug 131 using the photolithography technique is formed upon applying the antireflection film and the photoresist to the silicon substrate 101 in this order. The opening for providing the large diameter plug 131 is formed, while performing dry etching of the silicon substrate 101 with this photoresist film as the mask. At this time, the opening depth is appropriately selected, and the opening depth may be set to, for instance, not less than 50 µm to not more than 200 µm. Then, the photoresist and the antireflection film are removed.

Figure 4A:
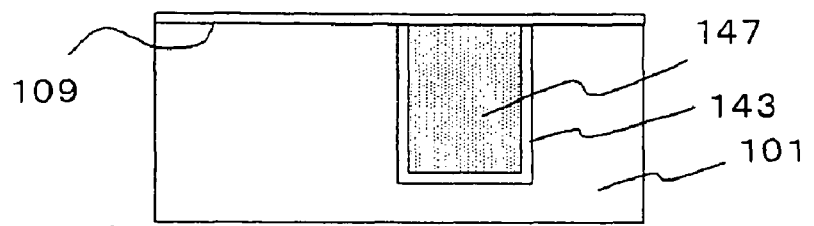
FIGS. 4A to 4D are cross-sectional views illustrating the manufacturing process of the semiconductor device of FIG. 3.

Next, the SiN film 143 of 100 nm is formed on the entire surface of the upper face of the silicon substrate 101 on which the opening corresponding to the shape of the large diameter plug 131 is provided. Then, the $SiO_2$ film 147 covers the entire surface of the main face of the silicon substrate 101 by applying SOG (spin on glass) so as to embed the opening. Next, the $SiO_2$ film 147 formed on the region other than the opening is removed to expose the upper face of the SiN film 143. Next, the SiN film is formed as for the etching stopper film 109, and the upper face of the $SiO_2$ film is coated with the etching stopper film 109 (FIG. 4A).

Figure 4B:
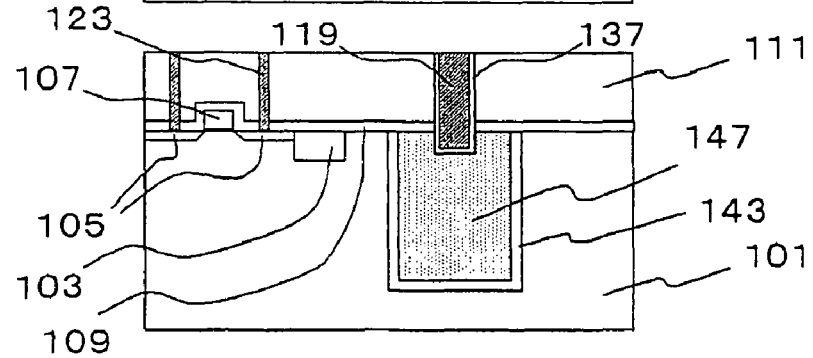

Next, like the first embodiment, there are provided the isolation film 103, the diffusion layer 105 and the gate electrode 107. Further, like the first embodiment, the lowermost insulating film 111 is formed, followed by being formed simultaneously the small diameter plug 119 penetrating the lowermost layer insulating film 111 and the connection plug 123 (FIG. 4B). It should be noted that, in the semiconductor device 102, it is possible to adopt a configuration where the small diameter plug 119 is put into the $SiO_2$ film 147 with the depth of, for instance, of 1 to 50 µm.

Then, like the first embodiment, the first interconnect layer insulating film 113, the first interconnect 121, the connection plug 122, the pad 125 and the bump 127 are formed. Then, the main face side of the silicon substrate 101 is fixed to the surface of the supporting component 117 via the adhesive layer 115.

Figure 4C:
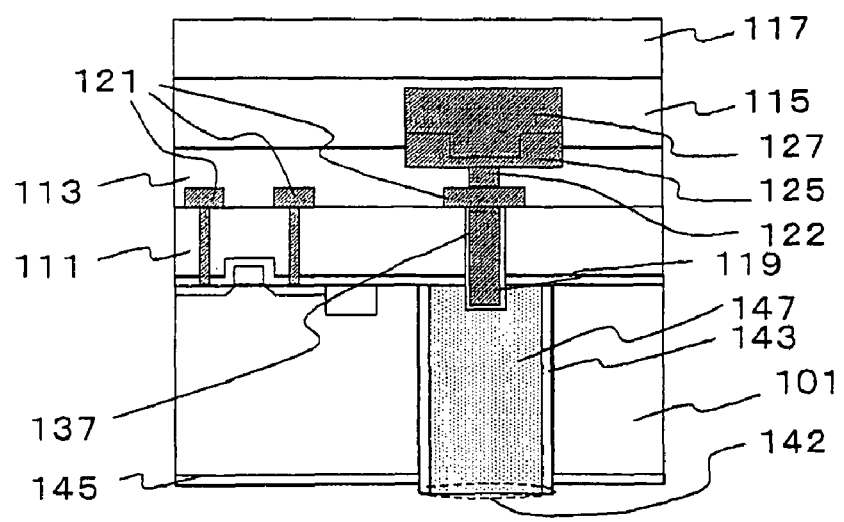

Next, the grinding rear surface of the silicon substrate 101 is performed to expose the lower face of the SiN film 143 provided on the bottom face of the $SiO_2$ film 147. At this time, it may be suitable that the $SiO_2$ film 147 is further exposed while advancing grinding rear surface. The dry etching of the rear surface of the silicon substrate 101 is further performed with the SiN film 143 or the $SiO_2$ film 147 as the mask. Owing to this, a protruding portion 142 is formed on a rear surface side of the silicon substrate 101. Then, the SiN film 145 is formed on the entire surface of the rear surface side of the silicon substrate 101. Then, the SiN in the rear surface of the silicon substrate 101 is removed by performing CMP to expose a lower face of the $SiO_2$ film 147 in the protruding portion 142 (FIG. 4C).

Next, the $SiO_2$ film 147 is removed by wet etching. A thick HF water solution, such as for instance, 40 to 49 wt % is used as for an etching solution. At this time, the $SiO_2$ film 147 is selectively removed because the etching stopper film 109 is provided on the upper face of the SiO$_2$ film 147 and the SiN film 143 is provided on the side face of the SiO$_2$ film 147. In such a way as above, the opening having the shape of the large diameter plug 131 is obtained and the protruding portion 141 is exposed.

Figure 4D:
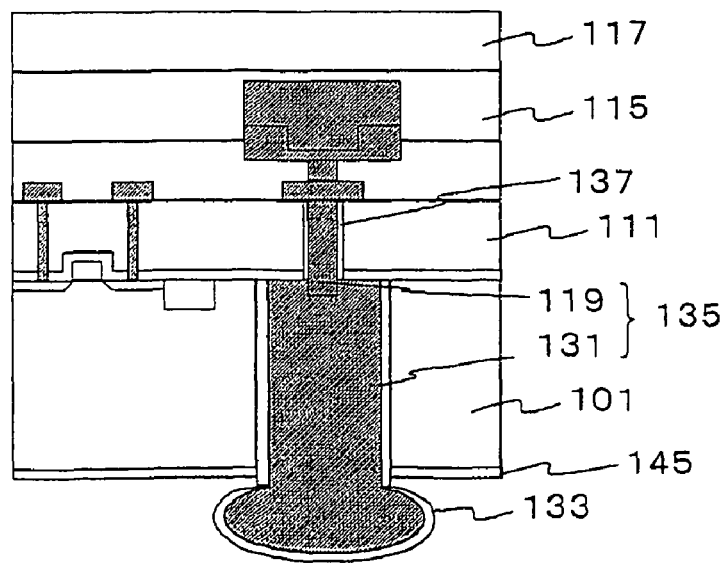

Then, like the first embodiment, the etching back of the SiN film 137 is performed, a Ni film is grown by electroless plating technique with an exposed portion of the small plug 119 as a starting point, followed by embedding the opening 139, and a bump is formed integrally at outside of the opening 139. Then, the large diameter plug 131 is formed, upon providing the Au plating film 133 on the surface of the bump (FIG. 4D).

Then, the supporting component 117 is removed by separating the adhesive layer 115 from the main face of the silicon substrate 101 and the semiconductor device 102 shown in FIG. 3 is obtained.

Next, there will be described effects of the semiconductor device 102 shown in FIG. 3. The semiconductor device 102 has the following effects in addition to the effect of the semiconductor device 100 described in the first embodiment.

The semiconductor device 102 has a configuration where the SiO$_2$ film 147 is formed on the position of the large diameter plug 131, before forming the transistor. Owing to this, the configuration makes it possible to perform a deep etching to form the large diameter plug 131 before forming elements. Accordingly, the SiO$_2$ film 147 may suitably be removed after grinding rear surface, on the occasion of providing the opening for forming the large diameter plug 131 on the rear surface side. Consequently, the large diameter plug 131 can be formed without performing the deep etching of the silicon substrate 101 after forming the transistor. Owing to this, the transistor or the like receives a little damage caused by plasma irradiation or the like, so that reliability is further improved.

In addition, in the semiconductor device 102, the protruding portion 142 is formed on the rear surface side of the silicon substrate 101. Owing to this, it is aimed that the Ni film is suppressed to come into contact with the silicon substrate 101 at the side face of the large diameter plug 131 or the bump. For this reason, the configuration is excellent in reliability.

In addition, on the occasion of grinding rear surface of the silicon substrate 101, there is adopted a configuration where the SiO$_2$ film 147 and the silicon substrate 101 are ground simultaneously. Owing to this, roughening of the rear surface of the through electrode 135 caused by a difference of grinding ratio is suppressed as compared to the case where a metal film and the silicon substrate 101 are ground simultaneously.

On the other hand, in the conventional through electrode, for instance, as described in Masataka Hoshino et al., grinding the rear surface is performed after forming electrodes. For this reason, the silicon substrate and the metal film should be ground simultaneously on the occasion of grinding the rear surface. However, the grinding ratio between these components is relatively large and, therefore, roughening the rear surface of the through electrode was easy. In addition, the metal film has high ductility and, therefore, shear drops are generated at the periphery of the rear surface electrode, and the shear drops adhere on the Si face. In the case that a metal such as Cu or the like, which is able to relatively diffuse readily in the Si, is included, in some cases, the metal is diffused in the silicon substrate. For this reason, in some cases, reliability of the elements such as the transistor or the like deteriorated.

On the contrary, in the semiconductor device 102 shown in FIG. 3, there is adopted a configuration where the SiO$_2$ film 147 and the silicon substrate 101 are ground simultaneously in grinding the rear surface, therefore, control of grinding the rear surface is easy, the configuration makes it possible to grind the rear surface stably, and the configuration makes it possible to have the flat rear surface. In addition, the configuration makes it possible to form the large diameter plug 131 stably. In addition, the side face and the bottom face of the large diameter plug 131 are coated with the SiN film 143 and the SiN film 145 respectively, therefore, the configuration where diffusion of the metal included in the large diameter plug 131 into the silicon substrate 101 is suitably suppressed is realized. Owing to this, the configuration, which is excellent in reliability of the elements such as the transistor or the like, is realized. In addition, the configuration is a configuration in which it is possible to reduce the manufacturing cost on the occasion of grinding rear surface.

It should be noted that, on the occasion of manufacturing the semiconductor device 102 according to the present embodiment, as described above, the dry etching of the silicon substrate 101 is performed to form the opening (not shown in FIG. 4A) for providing the large diameter plug 131. It is possible to utilize the process for dicing, on the occasion of manufacturing a plurality of semiconductor devices 102 on the wafer simultaneously.

Figure 9A:
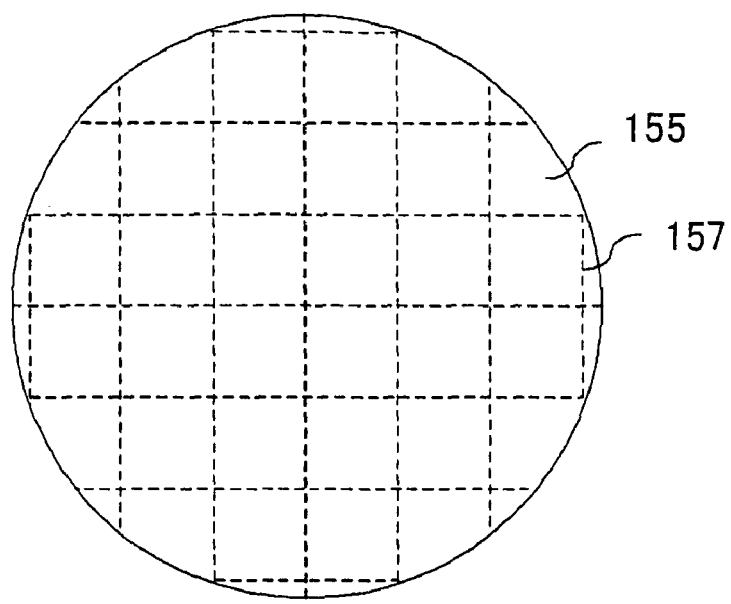
FIGS. 9A and 9B are plan views illustrating a method for manufacturing the semiconductor device according to the present embodiment.
Figure 9B:
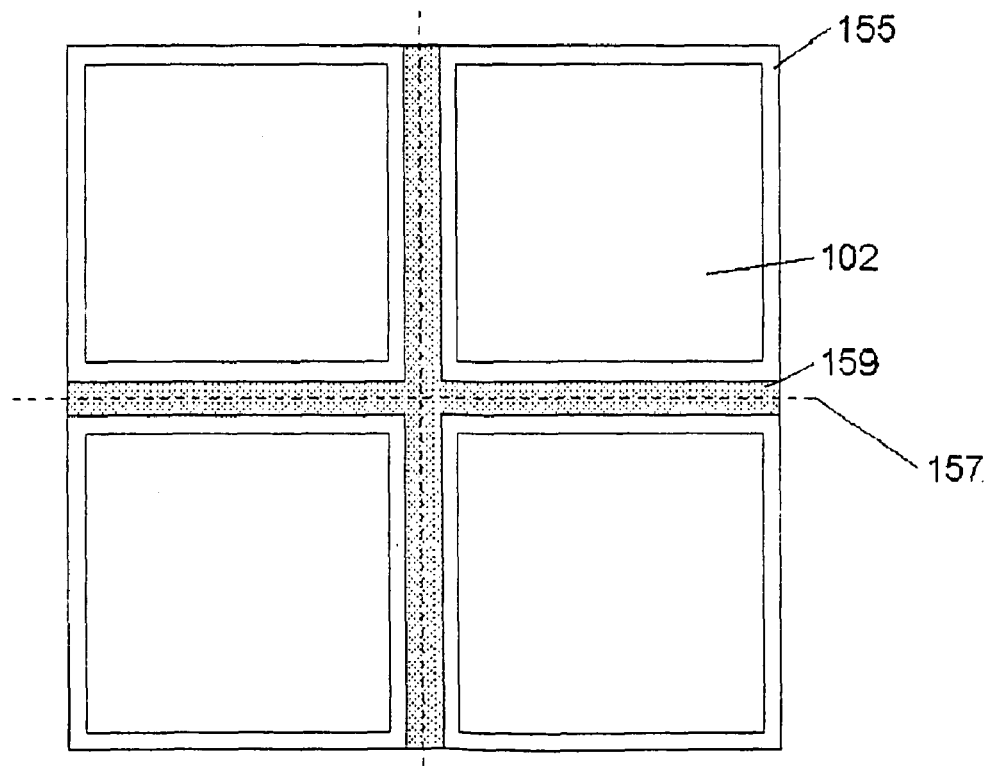

FIGS. 9A and 9B are plan views schematically showing the configuration of the wafer 155 during manufacture of the semiconductor device 102. FIG. 9A indicates the wafer 155 before dicing, and a dicing line 157 is indicated with a dotted line in the drawing. In addition, FIG. 9B is a drawing in which the vicinity of the dicing line 157 of FIG. 9A is enlarged. It should be noted that the wafer 155 corresponds to the silicon substrate 101 in the semiconductor device 102.

As shown in FIGS. 9A and 9B, the plurality of the semiconductor devices 102 are formed on the surface of the wafer 155. In the formation of the semiconductor device 102, a trench for dicing is formed on the dicing line 157 in the silicon substrate 101 at the same time as the formation of the large diameter plug 131. After that, the semiconductor device 102 is manufactured with the process described above. At this time, an opening formed in the vicinity of the dicing line 157 becomes a through trench 159 due to grinding rear surface. Then, plural semiconductor devices 102 are obtained in such a way that the whole wafer fractures along the dicing line 157 caused by the fact that the whole wafer is drawn, or it causes the whole wafer to deform while pressing it to a roller or the like.

In this method, in the wafer 155 in which the plurality of the semiconductor device 102 are formed, it is possible to provide the through trench 159 between forming regions of the semiconductor device 102. The wafer 155 on the inside of the through trench 159 is removed, therefore, the forming region of the through trench 159 can be thinner than another region. Owing to this, it is possible to perform division of the wafer 155 surely, by making this part a region of dicing.

In addition, the method can form the through trench 159 in the vicinity of the dicing line 157. For this reason, the configuration in which the dicing is easy to perform can be realized. The through trench 159 is obtained at the same time as the opening for forming the large diameter plug 131, therefore, it is not necessary to follow the other process to manufacture the through trench 159. Owing to this, the configuration is a configuration in which the low cost dicing is possible. For this reason, it is possible to include the dicing process into the rear surface process without increasing cost. In addition, it is possible to obtain a suitable scribing region for condition of the dicing upon adjusting an interval and size of the through trench 159. For this reason, the dicing with narrow pitch is possible, upon improving integration density of the through trench 159, for instance. That is, in this dicing method, it is possible to very minimize a dicing width and therefore it is possible to increase the number of chips to be taken from one wafer as compared with a process using usual blade.

Third Embodiment

Figure 5:
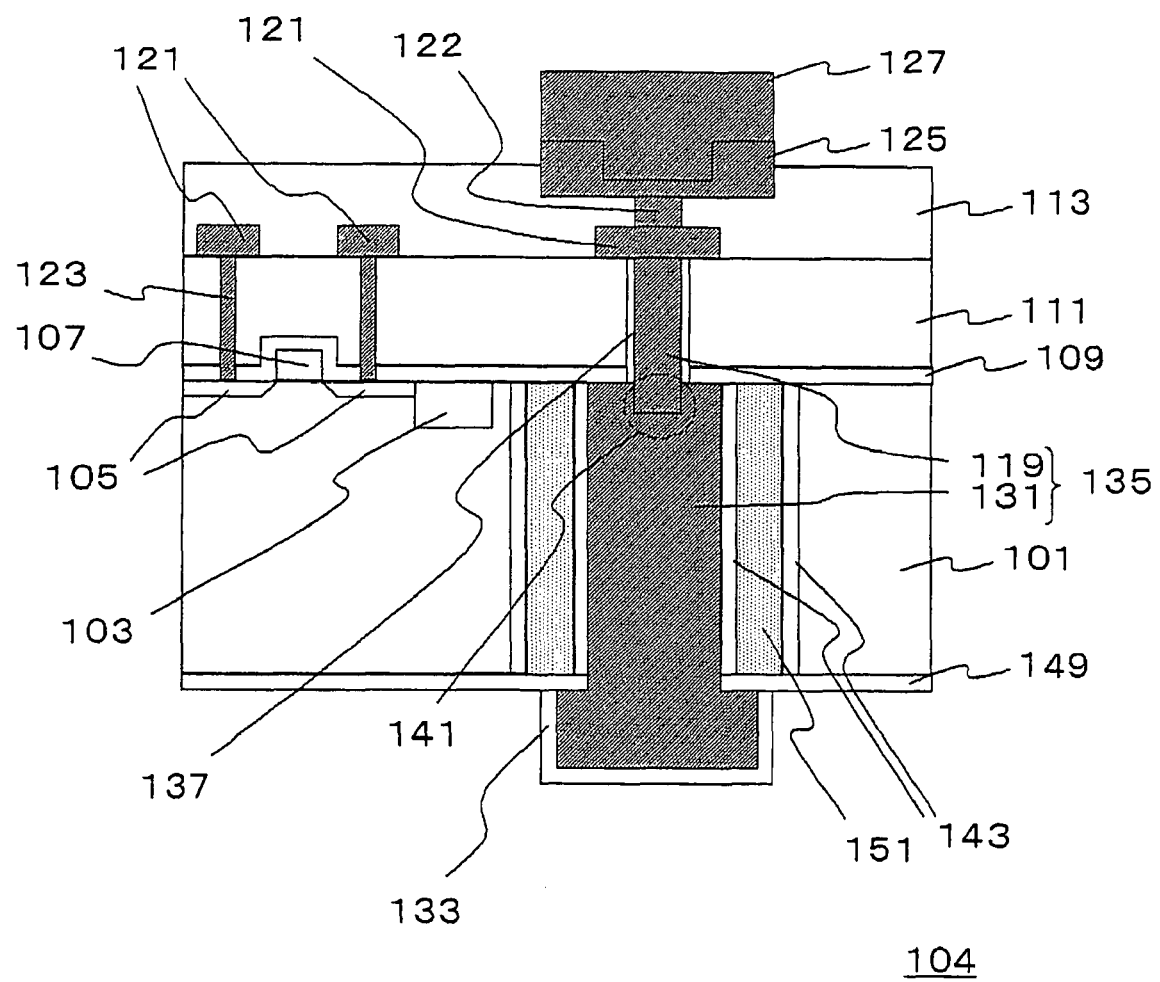
FIG. 5 is a cross-sectional view schematically showing configuration of the semiconductor device according to the present embodiment.

FIG. 5 is a cross-sectional view schematically showing a configuration of the semiconductor device according to the present embodiment. In a semiconductor device 104 shown in FIG. 5, there is provided an $SiO_2$ ring 151 to cover the periphery of the large diameter plug 131. The $SiO_2$ ring 151 is provided in such a way as to come into contact with the SiN film 143 in the side face of the large diameter plug 131. The side face of the $SiO_2$ ring 151 comes into contact with the silicon substrate 101 via the SiN film 143. In addition, like the second embodiment, the SiN film 149 is provided on the rear surface of the silicon substrate 101.

Next, there will be described a method for manufacturing the semiconductor device 104. FIGS. 6A to 6D are cross-sectional views schematically showing the manufacturing process of the semiconductor device 104 shown in FIG. 5.

Figure 6A:
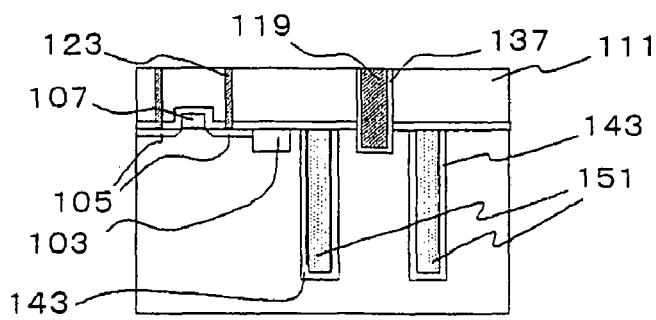
FIGS. 6A to 6D are cross-sectional views illustrating the manufacturing process of the semiconductor device of FIG. 5.

Firstly, the configuration shown in FIG. 6A is formed. At the beginning, the antireflection film and the photoresist are applied on the silicon substrate 101 in this order, a resist pattern (not shown in the drawings) having a cylindrical ring shaped opening corresponding to the shape of the $SiO_2$ ring 151 is formed using the photolithographic technique. The opening for providing the $SiO_2$ ring 151 is formed while performing the dry etching of the silicon substrate 101 with the photoresist as the mask. At this time, depth of the opening is appropriately selected, for instance, the depth of the opening may be set to not less than 50 µm to not more than 200 µm. Then, the photoresist film and the antireflection film are removed.

Next, the SiN film 143 of 100 nm is formed on the entire upper face of the silicon substrate 101 on which the opening corresponding to the shape of the $SiO_2$ ring. Then, the $SiO_2$ film is applied using SOG (spin on glass) to the entire face of the main face of the silicon substrate 101 so as to embed the opening. Next, the $SiO_2$ film formed on the region other than the opening is removed by CMP to expose the upper face of the SiN film 143. In such a way as above, the $SiO_2$ ring is obtained. Then, the SiN film as for the etching stopper film 109 is formed, and the upper face of the $SiO_2$ film 147 is coated with the etching stopper film 109.

Next, like the first embodiment, there are provided the isolation film 103, the diffusion layer 105 and the gate electrode 107. Further, like the first embodiment, the lowermost layer insulating film 111 is formed, and then the small diameter plug 119 and the connection plug 123 penetrating the lowermost layer insulating film 111 are formed simultaneously. It should be noted that, in the semiconductor device 102, the configuration in which the small diameter plug 119 is put into the silicon substrate 101 with a depth of, for instance, 1 to 50 µm can be realized.

Figure 6B:
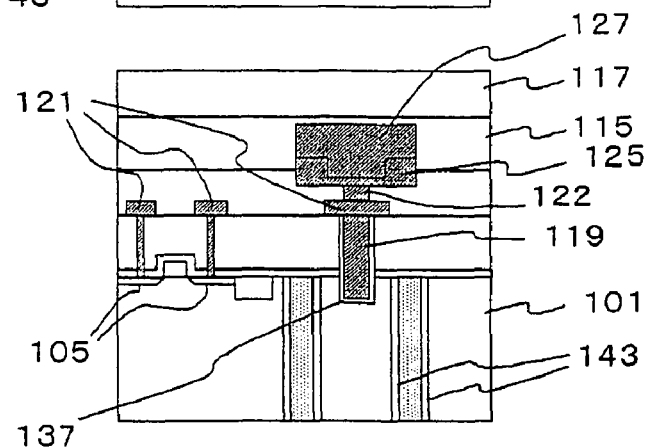

Next, configuration shown in FIG. 6B is formed. First, like the first embodiment, the first interconnect layer insulating film 113, the first interconnect 121, the connection plug 122, the pad 125 and the bump 127 are formed. Then, the main face is fixed on the surface of the supporting component 117 via the adhesive layer 115.

Next, like the first embodiment, grinding the rear surface of the silicon substrate 101 is performed. Also, in the present embodiment, thickness of the silicon substrate 101 after grinding may be set to, for instance, degree of 50 to 200 µm.

Figure 6C:
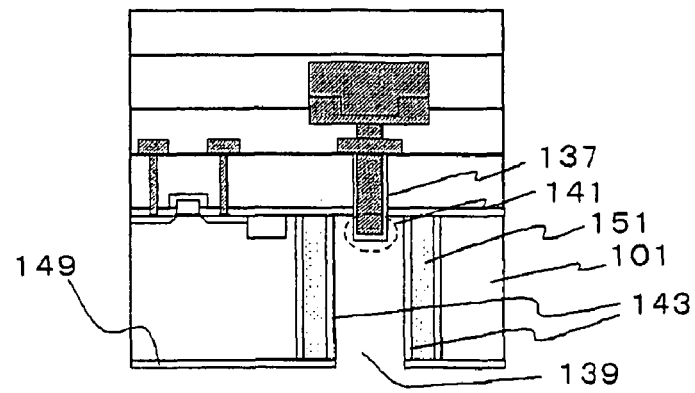

Next, the configuration shown in FIG. 6C is formed. At the beginning, the SiN film 149 of 20 nm is formed on the entire rear surface of the silicon substrate 101 after grinding.

Then, the antireflection film and the photoresist are applied on the rear surface of the silicon substrate 101 in this order, and then the resist pattern (not shown in the drawings) in which the inside of the $SiO_2$ ring 151 is opened is formed using the photolithographic technique. A wet etching of the rear surface of the silicon substrate 101 is further performed with the photoresist film as the mask. At this time, the wet etching is performed using, for instance, thick nitric fluoric acid. Owing to this, the silicon substrate 101 of the region surrounded by the $SiO_2$ ring 151 is removed, and the opening 139 is formed at the rear surface side of the silicon substrate 101. In addition, the protruding portion 141 is exposed in the opening 139.

Figure 6D:
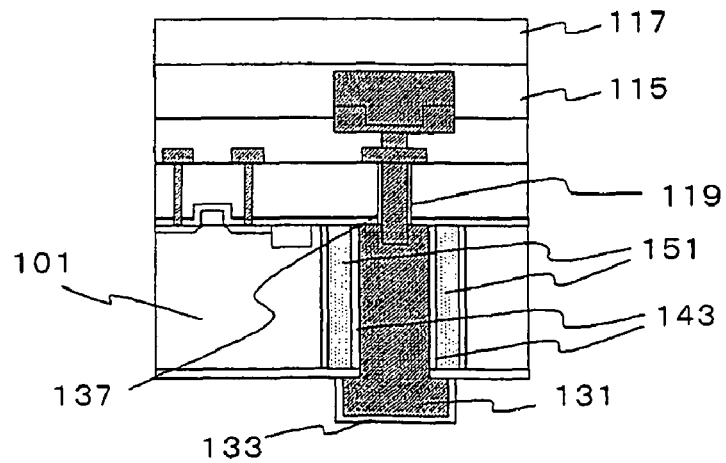

Next, the configuration shown in FIG. 6D is formed. The etching back of the SiN film 149 is performed, after removing the photoresist and the antireflection film. At this time, the SiN film 137 of the leading edge of the small diameter plug 119 is also removed. Then, TiW film and Cu film as a barrier metal film are formed in this order on the entire rear surface of the silicon substrate 101 using the sputtering technique. Then, the photoresist in which the opening 139 is opened is provided, on the rear surface of the silicon substrate 101, followed by embedding the opening 139 while causing the Ni film to grow due to the electrolytic plating technique, and the bump is integrally formed at the outside of the opening 139. Then, the Au plating film 133 is provided on the surface of the bump to obtain the large diameter plug 131. It should be noted that a rear surface interconnect may be formed at the same time as formation of the large diameter plug 131.

Then, the photoresist is removed, and the barrier metal film of the surface of the silicon substrate 101 is removed by the wet etching. Then, the supporting component 117 is removed upon separating the adhesive layer 115 from the main face of the silicon substrate 101, thus, the semiconductor device 104 shown in FIG. 5 is obtained.

Next, there will be described the effects of the semiconductor device 104 shown in FIG. 5. The semiconductor device 104 has the following effects in addition to the effect of the semiconductor device 100 (FIG. 1) described in the first embodiment.

In the semiconductor device 104, the $SiO_2$ ring 151 is formed laterally of the through electrode 135 in the silicon substrate 101. It is possible to reduce a parasitic capacitance upon providing a thick wall of the $SiO_2$ around the large diameter plug 131. Consequently, it is possible to speed up operation of the semiconductor device.

In addition, the $SiO_2$ ring 151 is provided within the silicon substrate 101 before forming the elements such as the transistor or the like. For this reason, like the case of the second embodiment, the configuration in which deterioration of reliability of the elements caused by formation of the $SiO_2$ ring 151 is suppressed is realized.

It should be noted that, in the semiconductor device 104, the $SiO_2$ ring 151 is formed laterally of the large diameter plug 131, however, the material of the ring may also be set to materials in addition to the $SiO_2$, if the material is the insulating material having durability to heating in the element formation process after the process. In addition, a cross-sectional shape of the $SiO_2$ ring 151 is not limited to a cylindrical ring if it is closed, but, for instance, the SiO₂ ring 151 may suitably be a ring shaped tubular body whose cross section is a rectangle.

In addition, also in the semiconductor device 104 according to the present embodiment, like the case of the semiconductor device (FIG. 3) described in the second embodiment, the SiO₂ ring 151 is formed in the vicinity of the dicing line 157 of the wafer 155 in addition to the side of the large diameter plug 131, owing to this, it is possible to realize configuration excellent in dicing property.

As above, there have been described embodiments of the invention. However, of course, the present invention is not limited to the above described embodiments, and the person skilled in the art is capable of changing the above described embodiment within the scope of the present invention.

For instance, in the embodiment described above, the silicon substrate is used as for the semiconductor substrate, however, a compound semiconductor substrate such as GaAs substrate or the like may suitably be used.

In addition, in the above described embodiment, W (tungsten) is used as for the material of the small diameter plug 119, however, another metal with high conductivity may suitably be used. For instance, metals such as Cu, Al, Ni, polysilicon or the like may suitably be used.

In addition, in the above described embodiment, there has been illustrated a configuration in which the small diameter plug 119 composing the through electrode 135 is connected to the first interconnect layer insulating film 113, however, there may be adopted a configuration, in which the small diameter plug is connected to a lower layered interconnect layer to be an upper portion upper than the first interconnect layer insulating film 113, which resides upper than the second interconnect layer.

Further, in the embodiment described above, there has been exemplified a configuration in which one small diameter plug 119 is put into the upper face of one large diameter plug 131, however, as shown in FIG. 7C, a configuration in which more than two small diameter plugs 119 are put into one large diameter plug 131 is possible. Owing to this, this makes it possible to further achieve anchor effect surely. Consequently, this makes it possible to be further reliable electrical contact between the small diameter plug 119 and the large diameter plug 131.

Further, there has been exemplified the case where both the small diameter plug 119 and the large diameter plug 131 composing the through electrode 135 are cylinders, however, if two cross sectional areas of respective plugs are different from each other, it is not limited to configurations where cylinders with respective different diameters are combined. The small diameter plug 119 or the large diameter plug 131 can be formed with columnar body, and, for instance, the shape thereof may suitably be a cylinder, an elliptical cylinder or a square column in which area of an upper face and bottom face are approximately identical with each other. Further, the shape of the plug may suitably be a shape of a frustum of circular cone, a frustum of an elliptical cone, or a frustum of a pyramid with no leading end on an upper face. Further, the columnar body may suitably be a stripe shape stretching in one direction.

Further, in the embodiment described above, also there can be adopted a configuration in which the upper face of the large diameter plug 131 is positioned at lower portion of the main face of the silicon substrate 101, in addition thereto, it may be possible to adopt a configuration making it possible to provide the large diameter plug 131 across vicinity of the main face from the rear surface of the silicon substrate 101. Further, even though the upper face of the large diameter plug 131 is somewhat protruded from the main face of the silicon substrate 101, the configuration may be suitable if the large diameter plug 131 is insulated on the upper face of the large diameter plug 131.

Further, in the embodiment described above, the adhesive layer 115 and the supporting component 117 are separated from the main surface of the silicon substrate 101, however, the adhesive layer 115 and the supporting component 117 are not separated, but they may form a part of the semiconductor device while remaining as they are if necessary.

It is apparent that the present invention is not limited to the above embodiment, that modified and changed without departing from the scope and sprit of the invention.

What is claimed is:

1. A semiconductor device comprising:
   a semiconductor substrate;
   an insulating layer provided on a main face of said semiconductor substrate; and
   a through electrode penetrating said semiconductor substrate and connected to a conductive component provided inside said insulating layer;
   wherein said through electrode comprises a first conductive plug connected to said conductive component; and
   a second conductive plug provided in said semiconductor substrate, having a cross sectional area larger than a cross sectional area of said first conductive plug, and wrapping a part of said first conductive plug therein, and
   wherein an upper face of said second conductive plug and an upper face of said semiconductor substrate lie substantially in the same plane.

2. The semiconductor device according to claim 1, wherein a plurality of said first conductive plugs electrically connect to one of said second conductive plug.

3. The semiconductor device according to claim 1, wherein a part of said first conductive plug extends into said second conductive plug.

4. The semiconductor device according to claim 1, wherein said second conductive plug comes into contact with said semiconductor substrate via an insulating film.

5. The semiconductor device according to claim 1, wherein said second conductive plug is projected from a rear face of said semiconductor substrate.

6. The semiconductor device according to claim 1, wherein a cylindrical ring shaped insulating body is disposed on an outer periphery of a side face of said second conductive plug.

7. A semiconductor device comprising:
   a semiconductor substrate;
   a transistor formed layer provided on a main face of said semiconductor substrate;
   an interconnect layer provided on an upper portion of said transistor formed layer;
   an upper interconnect layer provided on an upper portion of said interconnect layer; and
   a through electrode penetrating said transistor formed layer and said semiconductor substrate;
   wherein said through electrode comprises a first conductive plug provided in said transistor formed layer and connected to an interconnect formed in said interconnect layer; and
   a second conductive plug provided in said semiconductor substrate, having a cross sectional area larger than a cross sectional area of said first conductive plug, and connected to said first conductive plug, and
   wherein an upper face of said second conductive plug and an upper face of said semiconductor substrate lie substantially in the same plane; and wherein a part of said first conductive plug is wrapped in said second conductive plug.

8. The semiconductor device according to claim 7, wherein a plurality of said first conductive plugs electrically connect to one of said second conductive plug.

9. The semiconductor device according to claim 7, wherein a part of said first conductive plug extends into said second conductive plug.

10. The semiconductor device according to claim 7, wherein said second conductive plug comes into contact with said semiconductor substrate via an insulating film.

11. The semiconductor device according to claim 7, wherein said upper face of said second conductive plug and said main face lie substantially in the same plane.

* * * * *